US012525507B2

(12) United States Patent
Koyama et al.

(10) Patent No.: US 12,525,507 B2
(45) Date of Patent: Jan. 13, 2026

(54) SEMICONDUCTOR DEVICE HAVING SEMICONDUCTOR MODULE ON TOP PLATE OF COOLING DEVICE

(71) Applicant: FUJI ELECTRIC CO., LTD., Kawasaki (JP)

(72) Inventors: Takahiro Koyama, Matsumoto (JP); Daiki Yoshida, Matsumoto (JP); Yuichiro Hinata, Matsumoto (JP); Takafumi Yamada, Matsumoto (JP); Yoshihiro Tateishi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 390 days.

(21) Appl. No.: 18/184,193

(22) Filed: Mar. 15, 2023

(65) Prior Publication Data
US 2023/0215780 A1    Jul. 6, 2023

Related U.S. Application Data

(63) Continuation of application No. PCT/JP2022/009347, filed on Mar. 4, 2022.

(30) Foreign Application Priority Data

Apr. 7, 2021    (JP) .................................. 2021-065157

(51) Int. Cl.
*H01L 23/473*    (2006.01)
*H01L 23/00*    (2006.01)
*H01L 25/065*    (2023.01)

(52) U.S. Cl.
CPC ............ *H01L 23/473* (2013.01); *H01L 24/32* (2013.01); *H01L 25/0655* (2013.01); *H01L 2224/32225* (2013.01); *H01L 2924/1517* (2013.01)

(58) Field of Classification Search
CPC .... H01L 23/473; H01L 24/32; H01L 25/0655
See application file for complete search history.

(56) References Cited

U.S. PATENT DOCUMENTS 11,582,889 B2 *    2/2023    Yamada .................. H01L 23/46
2010/0232112 A1    9/2010    Uechi et al.
(Continued)

FOREIGN PATENT DOCUMENTS

JP    2005079386 A    3/2005
JP    2010212577 A    9/2010
(Continued)

OTHER PUBLICATIONS

International Search Report for PCT/JP2022/009347, mailed on May 31, 2022.
(Continued)

*Primary Examiner* — Michael Jung
(74) *Attorney, Agent, or Firm* — Rabin & Berdo, P.C.

(57) ABSTRACT

A cooling device including a rectangular top plate in a plan view having a front surface on which a semiconductor module is disposed and a rear surface having a sidewall connection region, a flow pass region, and an outer edge region. The flow pass region includes a cooling region and first and second communicating regions that sandwich the cooling region therebetween from a short-side direction of the top plate. The sidewall connection region surrounds an outer periphery of the flow pass region. The outer edge region is outside of the sidewall connection region and closer to an edge of the top plate than is the flow pass region. The cooling region has a first thickness, and the outer edge region has a second thickness that is greater than the first thickness.

23 Claims, 18 Drawing Sheets

(56) References Cited

U.S. PATENT DOCUMENTS

| | | | |
|---|---|---|---|
| 2013/0135824 A1 | 5/2013 | Harubeppu et al. | |
| 2014/0043765 A1* | 2/2014 | Gohara | H01L 23/473 361/699 |
| 2019/0109069 A1* | 4/2019 | Yamada | H01L 23/40 |
| 2020/0170147 A1 | 5/2020 | Arai | |
| 2021/0084799 A1 | 3/2021 | Yamada et al. | |
| 2021/0335693 A1 | 10/2021 | Yamada et al. | |

FOREIGN PATENT DOCUMENTS

| | | | |
|---|---|---|---|
| JP | 2013115297 A | 6/2013 |
| JP | 2014176892 A | 9/2014 |
| JP | 2020092250 A | 6/2020 |

OTHER PUBLICATIONS

Written Opinion for PCT/JP2022/009347, mailed on May 31, 2022.
The extended European Search Report dated Mar. 26, 2024, for the corresponding European patent application No. 22784386.9.

\* cited by examiner

SEMICONDUCTOR DEVICE HAVING SEMICONDUCTOR MODULE ON TOP PLATE OF COOLING DEVICE

CROSS-REFERENCE TO RELATED APPLICATION

This application is a continuation application of International Application PCT/JP2022/009347 filed on Mar. 4, 2022, which designated the U.S., which claims priority to Japanese Patent Application No. 2021-065157, filed on Apr. 7, 2021, the entire contents of which are incorporated herein by reference.

BACKGROUND OF THE INVENTION

1. Field of the Invention

The embodiments discussed herein relate to a semiconductor device.

2. Background of the Related Art

To maintain the reliability of a semiconductor module including power semiconductor elements, the semiconductor module is mounted on a cooling device. By doing so, the power semiconductor elements are cooled efficiently and reliably.

The cooling device has a top plate with a plurality of heat dissipating fins. In addition, the cooling device has formed therein an inlet and an outlet communicating with the inside of the cooling device. Coolant flowing from the inlet to the inside of the cooling device is circulated such that the coolant flows between the plurality of heat dissipating fins inside the cooling device and out of the outlet. When the semiconductor module is disposed at a position corresponding to the heat dissipating fins on the front surface of the top plate of the cooling device, heat from the semiconductor module is transferred to the heat dissipating fins through the top plate. The heat transferred to the heat dissipating fins is radiated by the coolant circulating inside the cooling device. As a result, the power semiconductor elements are cooled.

Japanese Laid-open Patent Publication No. 2005-079386
Japanese Laid-open Patent Publication No. 2010-212577

The top plate of such a cooling device is formed thick to ensure rigidity and to prevent liquid leakage due to corrosion caused by coolant. However, the top plate, if too thick, reduces the heat dissipation property, which leads to a reduction in the cooling performance of the cooling device.

SUMMARY OF THE INVENTION

According to an aspect, there is provided a semiconductor device, including: a semiconductor module including an insulated circuit substrate and a semiconductor chip mounted on the insulated circuit substrate; and a cooling device including a top plate having a front surface on which the semiconductor module is disposed and a rear surface opposite to the front surface, wherein the top plate is rectangular in a plan view of the semiconductor device and has a sidewall connection region, a flow pass region, and an outer edge region, each of which is respectively set at the rear surface of the top plate, the flow pass region including a cooling region, a first communicating region and a second communicating region, each extending in a long-side direction of the top plate, the first communicating region and the second communicating region sandwiching the cooling region therebetween from a short-side direction of the top plate, the sidewall connection region surrounding an outer periphery of the flow pass region, the outer edge region being outside of the sidewall connection region and closer to an edge of the top plate than is the flow pass region, and in a thickness direction orthogonal to the top plate, the cooling region has a first thickness and the outer edge region has a second thickness, the first thickness being less than is the second thickness.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Figure 1:
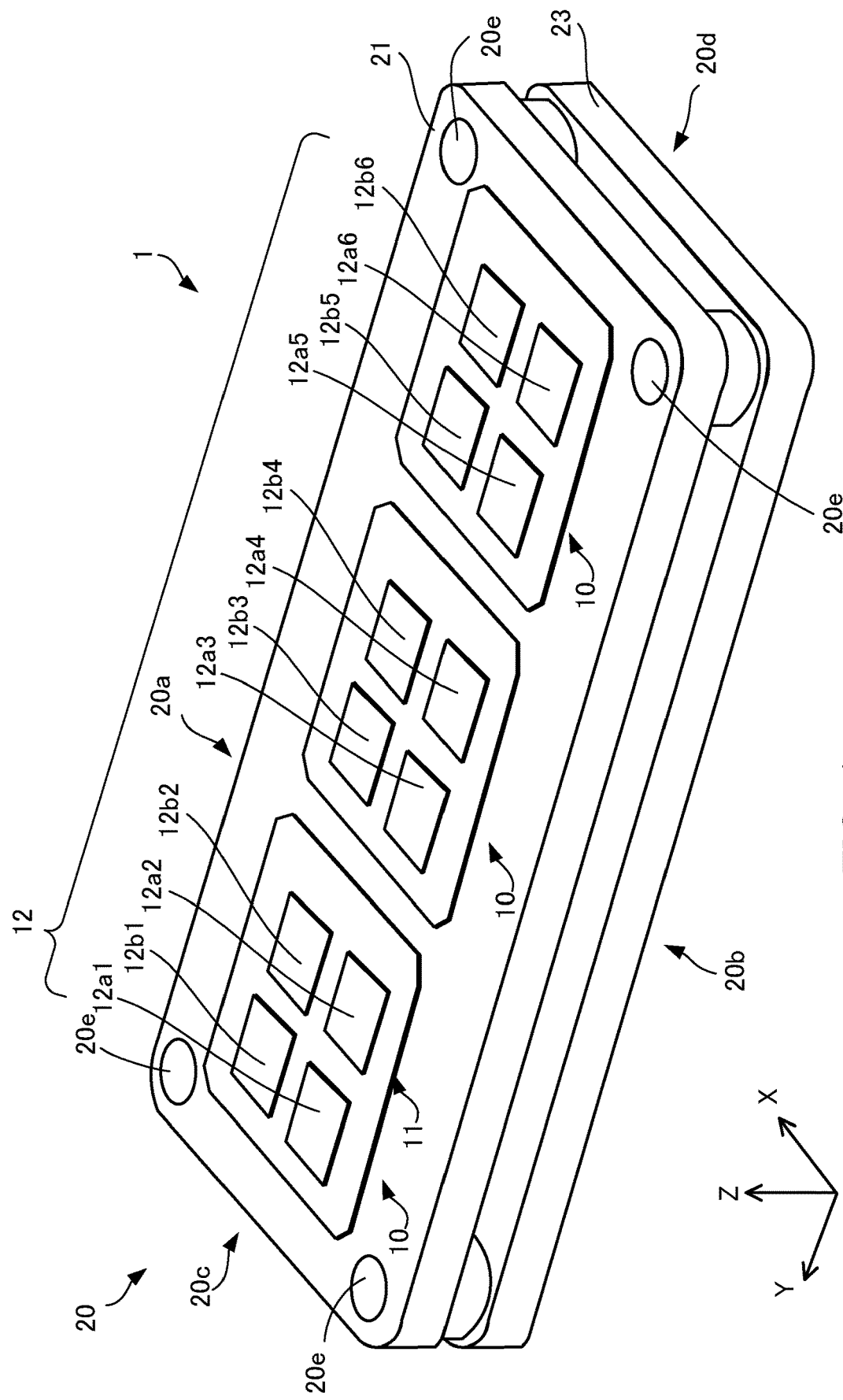
FIG. 1 is a perspective view of a semiconductor device according to a first embodiment.

Hereinafter, embodiments will be described with reference to the accompanying drawings. In the following description, the terms "front surface" and "upper surface" refer to a X-Y surface facing up (in the +Z direction) in a semiconductor device 1 and cooling devices 20 and 120 illustrated in drawings. Similarly, the term "up" refers to an upward direction (the +Z direction) in the semiconductor device 1 and cooling devices 20 and 120 illustrated in the drawings. The terms "rear surface" and "lower surface" refer to a X-Y surface facing down (in the −Z direction) in the semiconductor device 1 and cooling devices 20 and 120 illustrated in the drawings. Similarly, the term "down" refers to a downward direction (the −Z direction) in the semiconductor device 1 and cooling devices 20 and 120 illustrated in the drawings. The same directionality applies to other drawings, as appropriate. The terms "front surface," "upper surface," "up," "rear surface," "lower surface," "down," and "side surface" are used for convenience to describe relative positional relationships, and do not limit the technical ideas of the embodiments. For example, the terms "up" and "down" are not always related to the vertical directions to the ground. That is, the "up" and "down" directions are not limited to the gravity direction. In addition, in the following description, a "main component" refers to a component contained at a volume ratio of 80 vol % or more.

First Embodiment

First, a semiconductor device will be described with reference to FIG. 1. FIG. 1 is a perspective view of a semiconductor device according to a first embodiment. The semiconductor device 1 includes semiconductor modules 10 and a cooling device 20 on which the semiconductor modules 10 are mounted. In this connection, please refer to FIG. 4 for a semiconductor module 10.

The semiconductor modules 10 each include an insulated circuit substrate 11 and a plurality of semiconductor chips 12 bonded to the front surface of the insulated circuit substrate 11. In addition, the semiconductor modules 10 each may include a wiring member (not illustrated) that electrically connects the front surface of the insulated circuit substrate 11 and the main electrodes of the semiconductor chips 12. Examples of the wiring member include a bonding wire, a busbar, and a lead frame.

The semiconductor modules 10 may be disposed on a heat dissipation plate and be covered with a case. The case may be bonded to the outer periphery of the heat dissipation plate, on which the semiconductor modules 10 are disposed, with an adhesive. In addition, a sealing material may seal the inside of the case. The sealing material contains a thermosetting resin and a filler, which is mixed in the thermosetting resin. Examples of the thermosetting resin include an epoxy resin, a phenolic resin, and a maleimide resin. Examples of the filler include silicon oxide, aluminum oxide, boron nitride, and aluminum nitride. As an example, the sealing material contains an epoxy resin and a filler. Examples of the filler here include silicon dioxide, aluminum oxide, boron nitride, and aluminum nitride.

Figure 4:
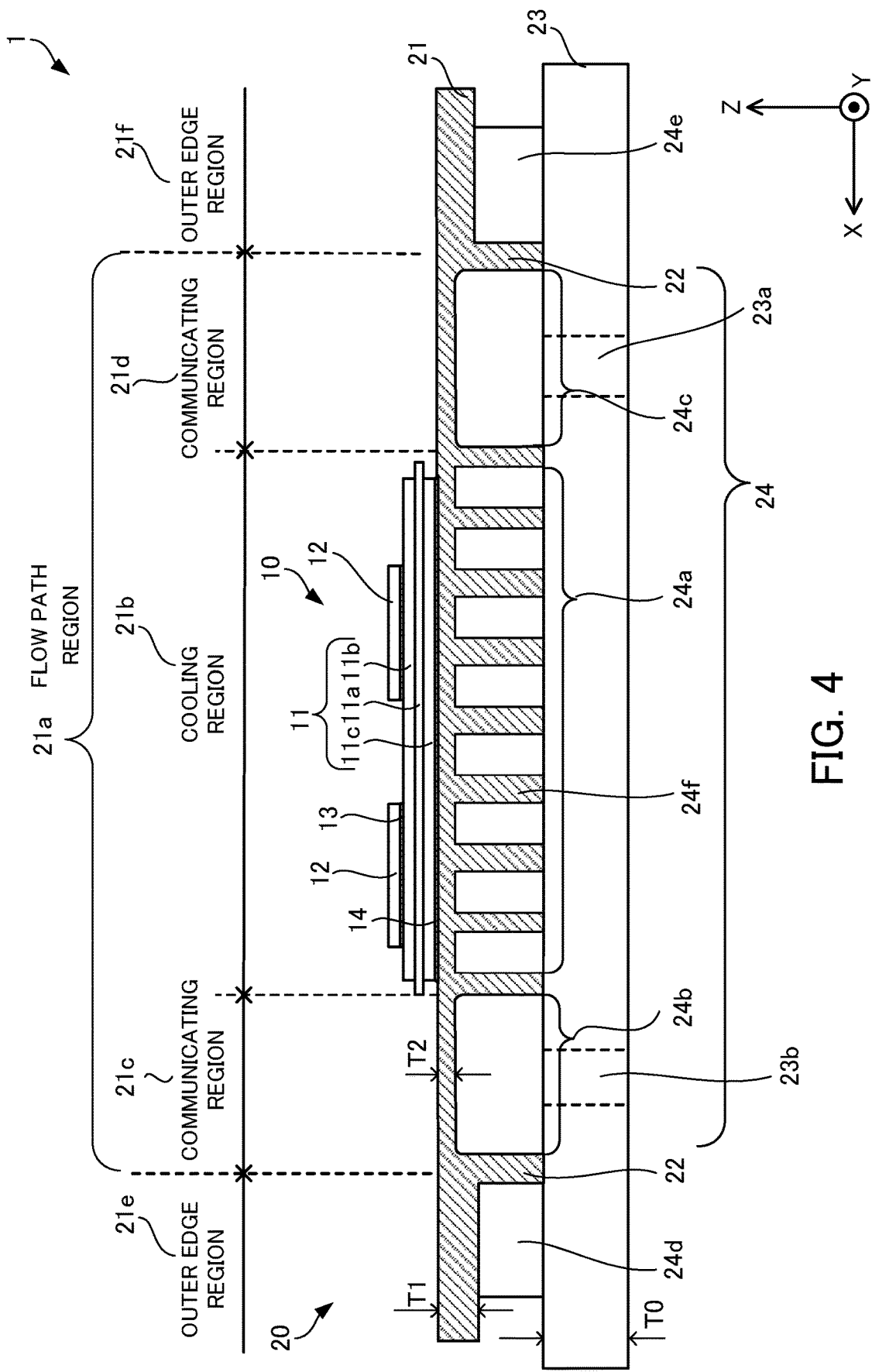
FIG. 4 is a sectional view of the cooling device included in the semiconductor device according to the first embodiment.

The insulated circuit substrate 11 includes an insulating plate 11a, a circuit pattern 11b formed on the front surface of the insulating plate 11a, and a metal plate 11c disposed on the rear surface of the insulating plate 11a (see FIG. 4). The insulating plate 11a and metal plate 11c are rectangular in plan view. In addition, the corners of the insulating plate 11a and metal plate 11c may be rounded or chamfered. In plan view, the metal plate 11c is smaller in size than the insulating plate 11a and is formed inside the insulating plate 11a. The insulating plate 11a is made of a material with an insulation property and high thermal conductivity. This insulating plate 11a is made of ceramics or insulating resin. The ceramics contain aluminum oxide, aluminum nitride, silicon nitride, or another. The insulating resin is a paper phenolic substrate, a paper epoxy substrate, a glass composite substrate, a glass epoxy substrate, or another. The insulating plate 11a has a thickness of 0.2 mm to 2.5 mm, inclusive.

The circuit pattern 11b is made of a metal with high electrical conductivity. Examples of the metal include copper, aluminum, and an alloy containing at least one of these. The circuit pattern 11b has a thickness of 0.1 mm to 2.0 mm, inclusive. Plating may be performed on the surface of the circuit pattern 11b to improve its corrosion resistance. Examples of the plating material used here include nickel, a nickel-phosphorus alloy, and a nickel-boron alloy. In this connection, the circuit pattern 11b illustrated in FIG. 4 is an example. The quantity, shape, size, and others of the circuit pattern 11b may desirably be determined according to necessity.

The metal plate 11c is smaller in size than the insulating plate 11a, is larger in size than an area where the circuit pattern 11b is formed, and is rectangular as with the insulating plate 11a. The corners of the metal plate 11c may be rounded or chamfered. The metal plate 11c is smaller in size than the insulating plate 11a and is formed on the entire surface of the insulating plate 11a except the edge portion thereof. The metal plate 11c is made of a metal with high thermal conductivity as a main component. Examples of the metal include copper, aluminum, and an alloy containing at least one of these. In addition, the metal plate 11c has a thickness of 0.1 mm to 2.5 mm, inclusive. Plating may be performed to improve the corrosion resistance of the metal plate 11c. Examples of the plating material used here include nickel, a nickel-phosphorus alloy, and a nickel-boron alloy.

As the insulated circuit substrate 11 configured as above, a direct copper bonding (DCB) substrate, an active metal brazed (AMB) substrate, or a resin insulating substrate may be used, for example.

The insulated circuit substrate 11 may be attached to the cooling device 20 via a bonding material 14. The bonding material 14 is a solder, a brazing material, or a sintered metal. A lead-free solder is used as the solder. For example, the lead-free solder contains, as a main component, an alloy containing at least two of tin, silver, copper, zinc, antimony, indium, and bismuth. The solder also may contain an additive. Examples of the additive include nickel, germanium, cobalt, and silicon. The solder containing the additive exhibits improved wettability, gloss, and bonding strength, which results in improving the reliability. The brazing material contains, as a main component, at least one of an aluminum alloy, a titanium alloy, a magnesium alloy, a zirconium alloy, and a silicon alloy, for example. The insulated circuit substrate 11 may be bonded by brazing using such a bonding material 14. The sintered metal contains silver and a silver alloy as a main component, for example. Alternatively, the bonding material 14 may be a thermal interface material. For example, the thermal interface material is an adhesive containing an elastomer sheet, a room temperature vulcanization (RTV) rubber, a gel, a phase change material, or another. The use of such a brazing material or thermal interface material for the attachment to the cooling device 20 improves the heat dissipation property of the semiconductor modules 10.

The semiconductor chips 12 include power device elements that are made of silicon as a main component. In this connection, this term, semiconductor chips 12, is a collective term for semiconductor chips 12a1 to 12a6 and 12b1 to 12b6. The semiconductor chips 12 have a thickness of 40 μm to 250 μm, inclusive, for example. A power device element may be a switching element or a diode element. The semiconductor chips 12a1 to 12a6 include switching elements. For example, a switching element may be an insulated gate bipolar transistor (IGBT) or a power metal oxide semiconductor field effect transistor (MOSFET). For example, the semiconductor chips 12a1 to 12a6 of this type each have a drain electrode (or a collector electrode) serving as a main electrode on the rear surface thereof and have a gate electrode and a source electrode (or an emitter electrode) respectively serving as a control electrode and a main electrode on the front surface thereof. The semiconductor chips 12b1 to 12b6 include diode elements. A diode element is a free wheeling diode (FWD) such as a Schottky barrier diode (SBD) or a P-intrinsic-N (PiN) diode, for example. The semiconductor chips 12b1 to 12b6 of this type each have a cathode electrode serving as a main electrode on the rear surface thereof and have an anode electrode serving as a main electrode on the front surface thereof.

At least one of the switching element and the diode element is selected as each semiconductor chip 12 according to necessity, and the rear surface of the selected element is mechanically and electrically bonded to a specified circuit pattern 11b with a bonding material 13. The bonding material 13 is a solder or a sintered metal. A lead-free solder is used as the solder. For example, the lead-free solder contains, as a main component, an alloy containing at least two of tin, silver, copper, zinc, antimony, indium, and bismuth. In addition, the solder may contain an additive. Examples of the additive include nickel, germanium, cobalt, and silicon. The solder containing the additive exhibits improved wettability, gloss, and bonding strength, which results in improving the reliability. Examples of a metal used for the sintered metal include silver and a silver alloy.

Figure 18:
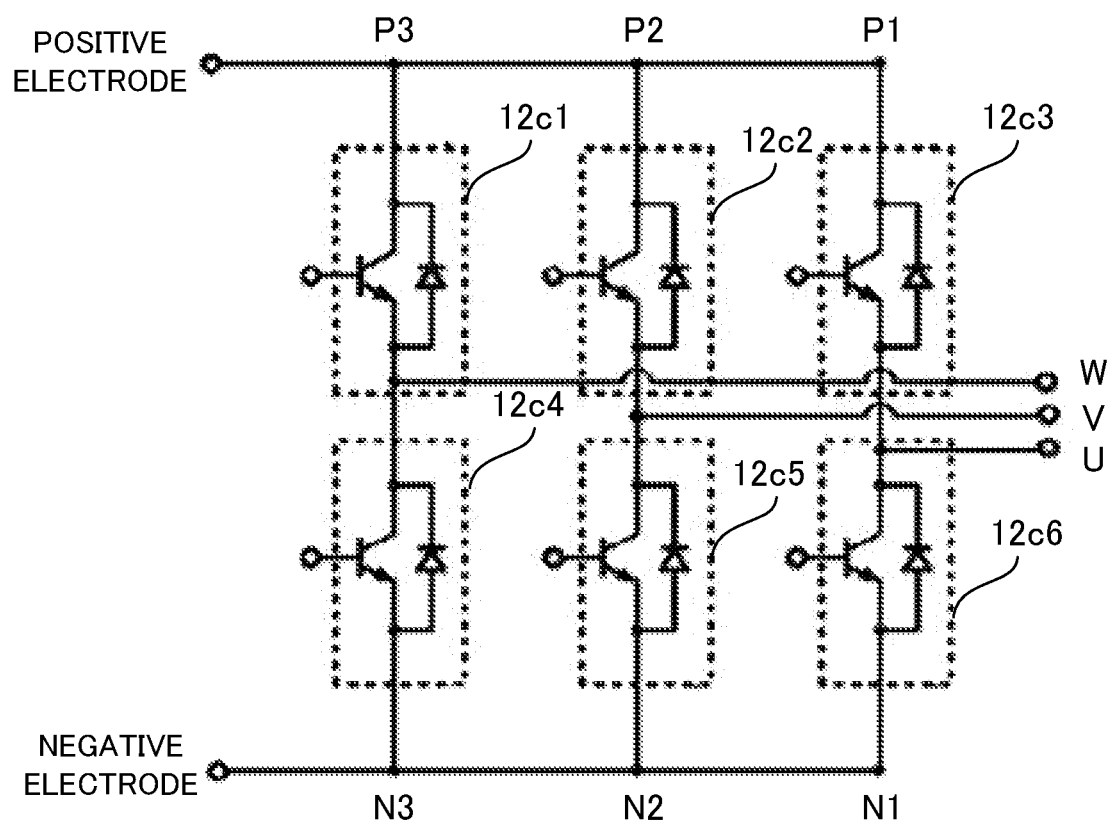
FIG. 18 illustrates an equivalent circuit included in a semiconductor device.

In addition, in place of a semiconductor chip 12, a reverse-conducting (RC)-IGBT chip that has the functions of both IGBT and FWD may be used (refer to semiconductor chips 12c1 to 12c6 of FIG. 18). Alternatively, the semiconductor chip 12 may be a power MOSFET that is made of silicon carbide as a main component. The semiconductor chip 12 of this type has an input electrode (drain electrode) serving as a main electrode on the rear surface thereof and has a gate electrode serving as a control electrode and an output electrode (a source electrode) serving as a main electrode on the front surface thereof.

In addition, for example, in place of or together with the semiconductor chips 12, a lead frame, external connection terminals (pin terminals, contact components, and others), and electronic parts (thermistor and current sensor) may be disposed according to necessity.

The cooling device 20 has an inlet that allows coolant to flow inside the cooling device 20 and an outlet that allows the coolant having flowed through the inside of the cooling device to flow out. The cooling device 20 exhausts heat from the semiconductor modules 10 via the coolant to thereby cool the semiconductor modules 10. In this connection, examples of the coolant include water, antifreeze (an aqueous solution of ethylene glycol), and long-life coolant (LLC). This cooling device 20 has a rectangular shape with long sides 20a and 20b and short sides 20c and 20d in plan view. In addition, fastening holes 20e are respectively formed at at least the four corners of the cooling device 20 in plan view. The fastening holes 20e are through holes, and bosses or the like of an external device to which the semiconductor device 1 is to be mounted are inserted in the fastening holes 20e so that the semiconductor device 1 is fastened to the external device. FIG. 1 illustrates the case where three semiconductor modules 10 are arranged along the long sides 20a and 20b at the central portion on the front surface of the cooling device 20. The number of semiconductor modules 10 is not limited to three. In addition, the positions and sizes of the semiconductor modules 10 are not limited to those illustrated in FIG. 1, provided that the semiconductor modules 10 are disposed at the central portion (a cooling region, to be described later) of the cooling device 20. In addition, the cooling device 20 may be provided with a pump and a heat dissipation device (or a radiator). The pump circulates the coolant by causing the coolant to flow into the inlet of the cooling device 20 and causing the coolant having been discharged from the outlet to flow back into the inlet. The heat dissipation device discharges to the outside heat from the coolant having absorbed the heat from the semiconductor modules 10.

Figure 2:
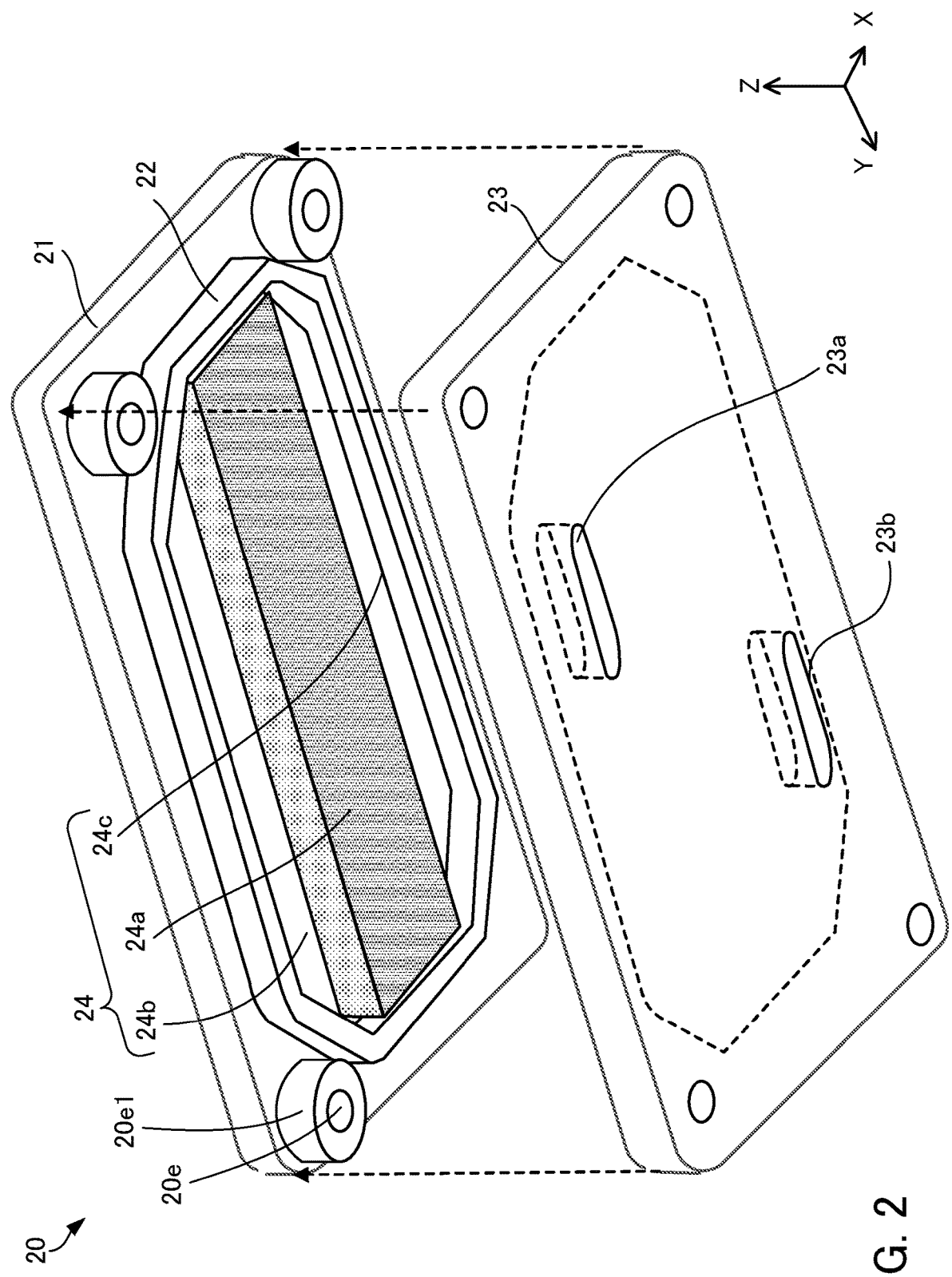
FIG. 2 is a view for describing a cooling device included in the semiconductor device according to the first embodiment.
Figure 3:
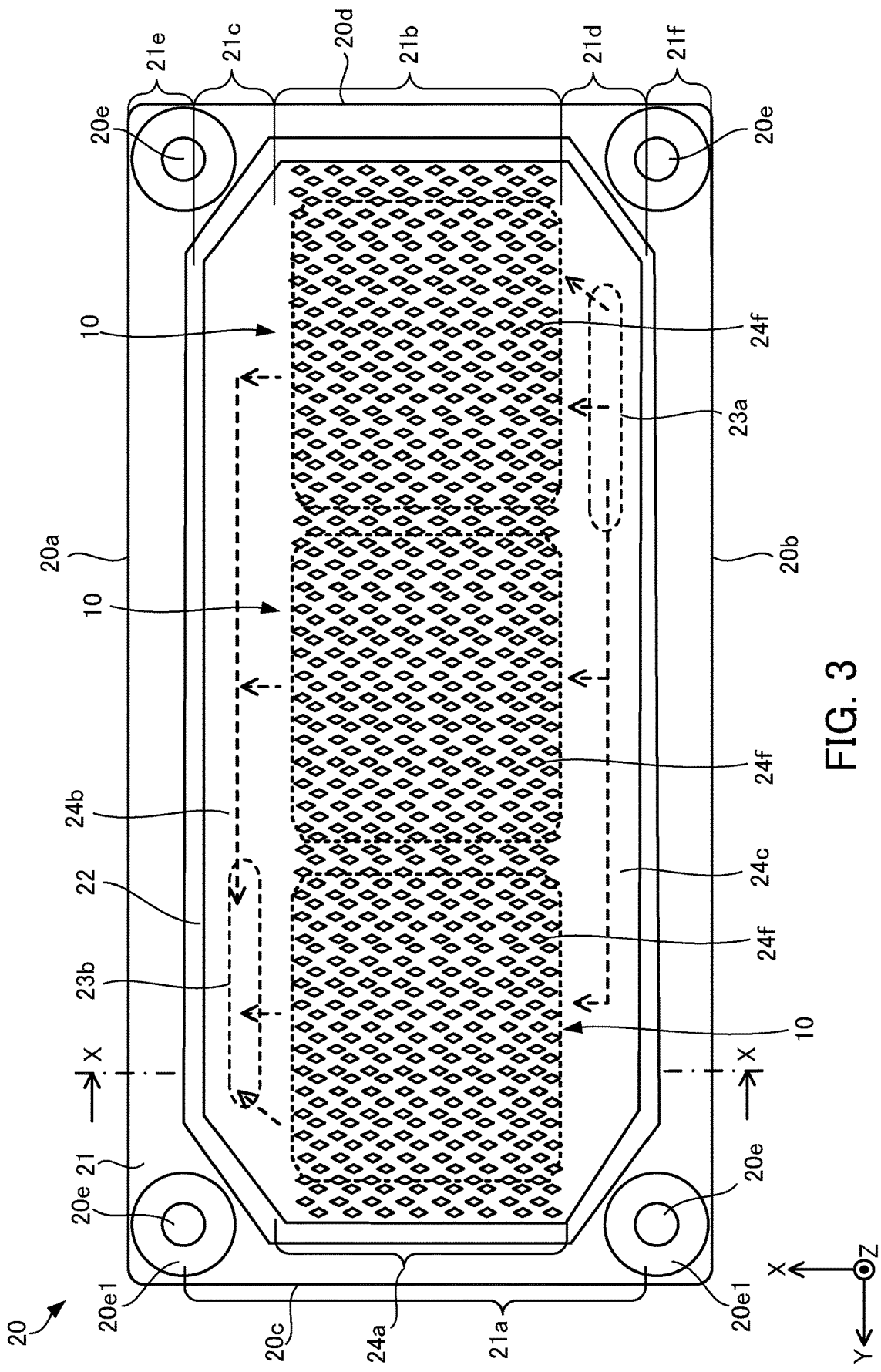
FIG. 3 is a plan view of the cooling device included in the semiconductor device according to the first embodiment.

The following describes the above cooling device 20 in detail with reference to FIGS. 2 to 4. FIG. 2 is a view for describing the cooling device included in the semiconductor device according to the first embodiment. FIG. 3 is a plan view of the cooling device included in the semiconductor device according to the first embodiment. FIG. 4 is a sectional view of the cooling device included in the semiconductor device according to the first embodiment. In this connection, FIG. 3 transparently illustrates the internal configuration of the cooling device 20 in plan view. FIG. 4 is a sectional view taken along a dash-dotted line X-X of FIG. 3.

The cooling device 20 includes a top plate 21, a sidewall 22 that is connected in a loop shape to the rear surface of the top plate 21, and a bottom plate 23 that is connected to the bottom surface of the sidewall 22 so as to face the top plate 21. The top plate 21 has a rectangular shape surrounded on the four sides by the long sides 20a and 20b and short sides 20c and 20d in plan view. The fastening holes 20e are formed at the four corners of the top plate 21, respectively. The corners of the top plate 21 may be rounded in plan view.

In addition, as illustrated in FIG. 3, the top plate 21 is sectioned into a flow path region 21a and outer edge regions 21e and 21f. In this connection, the sidewall 22 is connected to the rear surface of the top plate 21, as will be described later. The flow path region 21a is a region that is surrounded by the sidewall 22. The flow path region 21a is further sectioned into a cooling region 21b and communicating regions 21c and 21d in parallel to the long sides 20a and 20b. The cooling region 21b is a central rectangular region of the top plate 21 that extends in parallel to the long sides 20a and 20b (in the long-side direction). The plurality of semiconductor modules 10 are aligned along the Y direction in the cooling region 21b on the front surface of the top plate 21. In this connection, in FIG. 3, the positions of the semiconductor modules 10 are indicated in broken lines. The plurality of heat dissipating fins 24f are formed in the cooling region 21b on the rear surface of the top plate 21. The thickness (the length in the Z direction) of the top plate 21 varies depending on a region, as will be described later, but the maximum thickness T1 thereof is in the range of 2.0 mm to 5.0 mm, inclusive. In addition, the minimum thickness T2 thereof is 40% or more and 60% or less the thickness T1, and is in the range of 0.8 mm to 3.2 mm, inclusive, for example.

Figure 5:
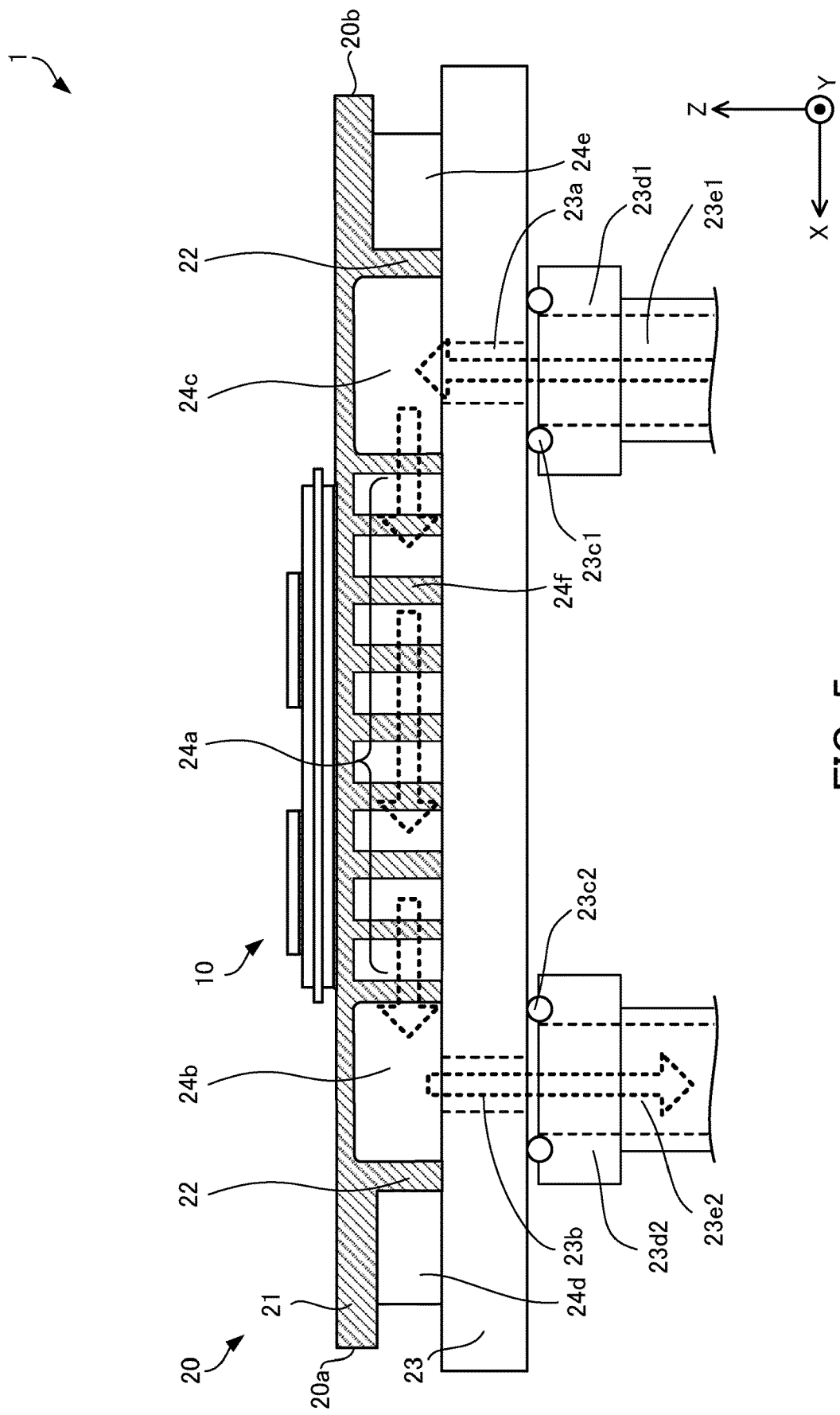
FIG. 5 is a view for describing a flow of coolant in the cooling device according to the first embodiment.

The plurality of heat dissipating fins 24f extend to connect the rear surface of the top plate 21 in the cooling region 21b and the bottom plate 23. The plurality of heat dissipating fins 24f have a height (a length in the Z direction) of 1.5 mm to 15.0 mm, inclusive, and preferably 2.0 mm to 12.0 mm, inclusive. In this connection, FIGS. 3 and 5 illustrate the planes and sides of the heat dissipating fins 24f, respectively. Please note that FIG. 5 schematically illustrates the heat dissipating fins 24f and therefore does not exactly match FIG. 3. In the cooling region 21b, the number of heat dissipating fins 24f arranged in the direction parallel to the long sides 20a and 20b is greater than the number of heat dissipating fins 24f arranged in the direction parallel to the short sides 20c and 20d. The cooling region 21b has regions where the heat dissipating fins 24f are provided and flow paths between the heat dissipating fins 24f. In this connection, the gaps between adjacent heat dissipating fins 24f may be narrower than the width of the heat dissipating fins 24f themselves. The heat dissipating fins 24f each have upper and lower ends in the ±Z directions. The upper ends of the heat dissipating fins 24f are thermally and mechanically connected to the rear surface of the top plate 21. The upper ends of the heat dissipating fins 24f are integrally formed with the top plate 21. That is to say, the heat dissipating fins 24f protrude integrally from the rear surface of the top plate 21 in the −Z direction. On the other hand, the lower ends of the heat dissipating fins 24f are fixed to the front surface of the bottom plate 23 (inside the cooling device 20). In addition, the heat dissipating fins 24f extend in the Z direction. This extending direction is approximately perpendicular to the principal surfaces of the top plate 21 and bottom plate 23. The heat dissipating fins 24f may be pin fins. In addition, the plurality of heat dissipating fins 24f are rectangular in cross section parallel to the principal surface of the top plate 21. Referring to FIG. 3, the heat dissipating fins 24f are rhombic in cross section. This allows more contact between the surface areas of the heat dissipating fins 24f and the coolant than the case where the heat dissipating fins 24f are circular in cross section, which results in improving the heat dissipation efficiency.

In addition, the plurality of heat dissipating fins 24f may be arranged in the cooling region 21b of the top plate 21 such that, when the coolant flows in a cooling section 24a, which will be described later, any side of the rectangular cross-section is not perpendicular to the main flow direction of the coolant in the cooling section 24a. In the present embodiment, the main flow direction of the coolant in the cooling region 21b is the X direction (the direction parallel to the short sides 20c and 20d). The plurality of heat dissipating fins 24f are arranged in the cooling region 21b such that any side of the rectangular cross-section is not perpendicular to the X direction. More specifically, the plurality of heat dissipating fins 24f are arranged such that any side of the rectangular cross-section is not perpendicular to the X direction, one diagonal thereof is parallel to the Y direction (parallel to the long sides 20a and 20b), and the other diagonal is parallel to the X direction. Alternatively, the plurality of heat dissipating fins 24f may be arranged such that any side of the rectangular cross-section is not perpendicular to the X direction, one diagonal thereof is inclined with respect to the Y direction, and the other diagonal is inclined with respect to the X direction. As compared with the case where the plurality of heat dissipating fins 24f are arranged in the cooling region 21b such that any side of the rectangular cross-section is perpendicular to the above-described flow direction, all of the above configurations are able to reduce a drop in the flow velocity of the coolant flowing through the cooling section 24a and thus to improve the heat dissipation efficiency.

In addition, the heat dissipating fins 24f each have a rhombic shape that is longer in the direction parallel to the short sides 20c and 20d than in the direction parallel to the long sides 20a and 20b in the X-Y plane illustrated in FIG. 3. Each side of the rhombic cross-section of the heat dissipating fins 24f may have a length of 0.5 mm to 0.8 mm, inclusive. The corners of the rhombic cross-section may be rounded. The plurality of heat dissipating fins 24f may be polygonal, for example, square in cross section. Alternatively, the heat dissipating fins 24f may be circular, for example, true circular in cross section. In addition, the plurality of heat dissipating fins 24f may be arranged in a predetermined pattern in the cooling region 21b. Referring to FIG. 3, the plurality of heat dissipating fins 24f are arranged in a staggered array. The plurality of heat dissipating fins 24f may be arranged in a grid array in the cooling region 21b.

The communicating regions 21c and 21d are regions that are located adjacent to both sides of the cooling region 21b on the top plate 21 and extend along the cooling region 21b. That is, each communicating region 21c and 21d is a region between the cooling region 21b and the sidewall 22 (on the side facing the long side 20a or 20b). Referring to FIG. 3, the communicating regions 21c and 21d are trapezoidal. Alternatively, the communicating regions 21c and 21d may be rectangular, semicircular, or mountain range-shaped with a plurality of peaks, for example, depending on an area surrounded by the sidewall 22. In addition, the corners of the communicating regions 21c and 21d may be rounded with a curve in plan view. This means that the bends of the sidewall 22 defining the communicating regions 21c and 21d are rounded. This facilitates a flow of the coolant through the communicating regions 21c and 21d without allowing the coolant to stay at the smooth corners. Therefore, it is possible to prevent the occurrence of corrosion at the corners. In addition, the communicating regions 21c and 21d do not need to be symmetrical. The outlet 23b and inlet 23a are formed at positions closer to the short sides 20c and 20d so as to correspond to the communicating regions 21c and 21d, respectively, as will be described in detail later. In addition, the outlet 23b and inlet 23a are formed at the central portions in the X direction of the communicating regions 21c and 21d, respectively. The communicating regions 21c and 21d may have shapes that enable the coolant to easily flow out of the outlet 23b and flow in the inlet 23a, respectively. For example, the communicating region 21c may have a shape that becomes narrower as it approaches the outlet 23b so as to cause the coolant to flow into the outlet 23b.

The outer edge regions 21e and 21f are regions of the top plate 21 outside the flow path region 21a (the cooling region 21b and communicating regions 21c and 21d). More specifically, each outer edge region 21e and 21f is between the sidewall 22 of the top plate 21 and the outer edge of the top plate 21 in plan view. The fastening holes 20e described earlier and fastening reinforcing members 20e1 are formed in the outer edge regions 21e and 21f. The top plate 21 in the outer edge regions 21e and 21f has the maximum thickness T1 of the top plate 21.

The top plate 21 in at least the cooling region 21b has the thickness T2, which is thinner than the thickness T1 in the outer edge regions 21e and 21f of the top plate 21. Here, the top plate 21 also has the thickness T2 in the communicating regions 21c and 21d. In addition, the front surface of the top plate 21 on which the semiconductor modules 10 are mounted has a flat surface without any steps in the thickness direction (the Z direction), and is level. The rear surface of the top plate 21 is recessed toward the front surface thereof in the cooling region 21b and communicating regions 21c and 21d.

The sidewall 22 is formed on the rear surface of the top plate 21 in a loop shape so as to surround the cooling region 21b and communicating regions 21c and 21d. The upper end of the sidewall 22 in the +Z direction is fixed to the rear surface of the top plate 21. In addition, the lower end of the sidewall 22 in the −Z direction is fixed to the front surface of the bottom plate 23. Referring to FIG. 3, the sidewall 22 has eight sides including portions parallel to the short sides 20c and 20d along the cooling region 21b, portions parallel to the long sides 20a and 20b along the communicating regions 21c and 21d, and portions connecting these portions. The bent corners of the inner surface of the loop-shaped sidewall 22 may be rounded. The sidewall 22 does not need to have eight sides, provided that the sidewall 22 surrounds the rectangular cooling region 21b and the communicating regions 21c and 21d on both sides of the cooling region 21b in plan view. In addition, the height (the length in the Z direction) of the sidewall 22 corresponds to the height of the plurality of heat dissipating fins 24f, and is, for example, in the range of 1.5 mm to 15.0 mm, inclusive, and preferably 2.0 mm to 12.0 mm, inclusive. In this connection, in the case where the height of the sidewall 22 varies between the side thereof facing the outer edge region 21e or 21f and the side thereof facing the communicating region 21c or 21d, the height of the sidewall 22 refers to the height on the side facing the communicating region 21c or 21d. In this case, the height on the side of the sidewall 22 facing the communicating region 21c or 21d may be the height calculated by subtracting the thickness T2 in the communicating regions 21c and 21d of the top plate 21 from the thickness T1 in the outer edge regions 21e and 21f of the top plate 21 and adding the subtraction result to the height in the outer edge regions 21e and 21f of the sidewall 22. In addition, the thickness (the length in the X direction) of the sidewall 22 is set such that the sidewall 22, when sandwiched between the top plate 21 and bottom plate 23 as will be described later, enables the cooling device 20 to keep sufficient strength without causing a reduction in cooling performance. As an example, the thickness is in the range of 1.0 mm to 3.0 mm, inclusive.

In addition, the fastening reinforcing members 20e1 may be formed respectively around the fastening holes 20e on the rear surface of the top plate 21 (inside the cooling device 20). Each fastening reinforcing member 20e1 has a through hole therein corresponding to the fastening hole 20e. The sidewall 22, when sandwiched between the top plate 21 and the bottom plate 23, enables the cooling device 20 to keep sufficient strength. To this end, the height of the fastening reinforcing members 20e1 is approximately equal to the height of the sidewall 22. More specifically, the height of the fastening reinforcing members 20e1 is approximately equal to the height on the side of the sidewall 22 facing the outer edge region 21e. In addition, the height of the fastening reinforcing members 20e1 may be approximately equal to the height calculated by subtracting the height (T1-T2) of a stepped portion 21g, to be described later, from the height of the plurality of heat dissipating fins 24f. The width (the length from the center of a fastening hole 20e in the radial direction in plan view) of each fastening reinforcing member 20e1 is at least 0.7 times but 2.0 times or less the diameter of the fastening hole 20e.

The bottom plate 23 is flat plate shaped and has the same shape as the top plate 21 in plan view. More specifically, the bottom plate 23 has a rectangular shape surrounded on the four sides by long sides and short sides in plan view, and has fastening holes corresponding to the top plate 21 at the respective four corners thereof. In addition, the corners of the bottom plate 23 may be rounded as well. In addition, the bottom plate 23 has a front surface and a rear surface that are parallel to each other. The rear surface of the bottom plate 23 has a flat surface without any steps and is level. In addition, the rear surface of the bottom plate 23 and the front surface of the top plate 21 may be parallel to each other as well. The bottom plate 23 has the inlet 23a and outlet 23b through which the coolant flows in and out. The inlet 23a is formed at a position closer to the long side 20b and the short side 20d so as to correspond to the communicating region 21d. The outlet 23b is formed at a position closer to the long side 20a and short side 20c so as to correspond to the communicating region 21c. That is, the inlet 23a and outlet 23b are formed at positions that have point symmetry with respect to the center of the bottom plate 23. When this bottom plate 23 is connected to the sidewall 22, the fastening reinforcing members 20e1 become connected around the corresponding fastening holes formed in the bottom plate 23. The bottom plate 23 needs to have a thickness that enables the cooling device 20 to keep sufficient strength as a whole without causing a reduction in the cooling performance. In addition, the bottom plate 23 needs to be strong enough to allow drains to be attached to the inlet 23a and outlet 23b as will be described later. To this end, the thickness TO of the bottom plate 23 is at least 1.0 times but 5.0 times or less, and more preferably, at least 2.0 times but 3.0 times or less the thickness T1 in the outer edge regions 21e and 21f of the top plate 21. For example, the thickness TO of the bottom plate 23 is preferably in the range of 2.0 mm to 10.0 mm, inclusive.

Inside the cooling device 20 configured as above, a flow path section 24 is formed by the top plate 21, sidewall 22, and bottom plate 23. The flow path section 24 is sectioned into a cooling section 24a corresponding to the cooling region 21b and communicating sections 24b and 24c corresponding to the communicating regions 21c and 21d. The plurality of heat dissipating fins 24f extend so as to connect the top plate 21 and the bottom plate 23 in the cooling section 24a. The communicating section 24b is formed by the top plate 21 in the communicating region 21c, the sidewall 22, and the bottom plate 23, and the communicating section 24c is formed by the top plate 21 in the communicating region 21d, the sidewall 22, and the bottom plate 23. The communicating section 24c connects to the cooling section 24a. The coolant having entered the inlet 23a flows from the communicating section 24c into the cooling section 24a. The communicating section 24b connects to the cooling section 24a. The coolant from the cooling section 24a flows into the communicating section 24b and out of the outlet 23b. The flow of the coolant through the cooling device 20 will be described later. In addition, in the cooling device 20, the screw frames 24d and 24e are formed by the outer sides of the sidewall 22 and the bottom plate 23 in the outer edge regions 21e and 21f of the top plate 21.

The cooling device 20 is made of a metal with high thermal conductivity as a main component. Examples of the metal include copper, aluminum, and an alloy containing at least one of these. Plating may be performed to improve the corrosion resistance of the cooling device 20. Examples of the plating material used here include nickel, a nickel-phosphorus alloy, and a nickel-boron alloy. In addition, the top plate 21 with the plurality of heat dissipating fins 24f is formed by forging or casting (die casting), for example. In the case of the forging, a block-shaped member made of a metal described above as a main component is pressed using a mold so as to cause plastic deformation, thereby obtaining the top plate 21 with the plurality of heat dissipating fins 24f and sidewall 22. In the case of the die casting, a molten die cast material is poured in a mold and is then cooled and removed from the mold, thereby obtaining the top plate 21 with the plurality of heat dissipating fins 24f and sidewall 22. In addition, for example, the die cast material used here is an aluminum-based alloy. Alternatively, the top plate 21 with the plurality of heat dissipating fins 24f and sidewall 22 may be formed by cutting a block-shaped member made of a metal described above as a main component.

The bottom plate 23 is bonded to the plurality of heat dissipating fins 24f and the sidewall 22 of the top plate 21. The bonding here is performed by brazing. That is, the bottom surfaces of the end portions of the sidewall 22 and heat dissipating fins 24f extending from the principal surface (rear surface) of the top plate 21 are bonded to the front surface of the bottom plate 23 via a brazing material. In the case where the top plate 21 is formed by casting, the brazing material used in the brazing process has a melting point lower than that of the die cast material. As an example, the brazing material is an alloy containing aluminum as a main component.

Note that the fastening reinforcing members 20e1 may be formed on the top plate 21 separately and joined to the bottom plate 23 by brazing. Also, the present embodiment provides a configuration in which the plurality of heat dissipating fins 24f connect to the top plate 21. However, the configuration is not limited to this. The plurality of heat dissipating fins 24f may be formed in a region of the bottom plate 23 corresponding to the cooling region 21b. In the manner described above, the cooling device 20 is obtained.

The following describes a flow of the coolant in the cooling device 20 with reference to FIG. 5 (and FIG. 3). FIG. 5 is a view for describing a flow of coolant in the cooling device according to first embodiment. Note that FIG. 5 corresponds to FIG. 4. In addition, broken arrows in FIG. 5 indicate a direction in which the coolant flows. The same applies to the broken arrows of FIG. 3.

Inside the cooling device 20, the coolant is circulated by a pump, as described earlier. To circulate the coolant, a drain head 23d1 is attached to the inlet 23a via a ring-shaped rubber seal 23c1 that surrounds the inlet 23a. A drain pipe 23e1 is attached to the drain head 23d1. Similarly, a drain head 23d2 is attached to the outlet 23b via a ring-shaped rubber seal 23c2 that surrounds the outlet 23b. A drain pipe 23e2 is attached to the drain head 23d2. The pump is connected to the drain pipes 23e1 and 23e2.

As illustrated in FIG. 3, the coolant that has flowed in from the inlet 23a flows into the communicating section 24c and spreads out inside the communicating section 24c. The coolant that has flowed in the communicating section 24c spreads out toward both the short side 20c (in the Y direction) and the long side 20a (in the X direction). In addition, the coolant that has flowed in from the inlet 23a flows directly toward the long side 20a (in the X direction). In this manner, the coolant flows to the entire side portion of the cooling section 24a facing the long side 20b.

As illustrated in FIG. 5, the coolant that has flowed to the side portion of the cooling section 24a (facing the long side 20b) flows between the plurality of heat dissipating fins 24f toward the long side 20a (in the X direction). Heat from the semiconductor modules 10, which have heated up, is transferred via the top plate 21 to the plurality of heat dissipating fins 24f. When passing between the plurality of heat dissipating fins 24f, the coolant absorbs this heat from the plurality of heat dissipating fins 24f. In the cooling device 20, the thickness T2 in the cooling region 21b of the top plate 21 is thinner than the thickness T1 thereof in the outer edge regions 21e and 21f. That is, the distance from the front surface of the top plate 21 in the cooling region 21b to the plurality of heat dissipating fins 24f is shortened. This facilitates transfer of the heat of the semiconductor modules 10 to the plurality of heat dissipating fins 24f. A large amount of heat may be transferred to the coolant that passes through the gaps between the heat dissipating fins 24f, which improves the cooling performance.

As illustrated in FIG. 3 (and FIG. 5), the coolant that has absorbed the heat as described above flows from the side portion of the cooling section 24a facing the long side 20a into the communicating section 24b, and then flows to the outside through the outlet 23b. The coolant that flows out contains the heat that has been transferred from the plurality of heat dissipating fins 24f. The coolant that has flowed out is cooled by a heat dissipation device and is pumped back into the cooling device 20 from the inlet 23a. By exhausting the heat of the semiconductor modules 10 to the outside through the circulation of the coolant through the cooling device 20, the semiconductor modules 10 are cooled.

In the cooling device 20, the thickness T2 in the communicating regions 21d and 21c of the top plate 21 in addition to the cooling region 21b is made thinner than the thickness T1 in the outer edge regions 21e and 21f of the top plate 21. That is, the volumes (cross sections) of the cooling section 24a and communicating sections 24b and 24c increase. This reduces the pressure loss of the coolant that flows through the cooling section 24a and communicating sections 24b and 24c, which allows the coolant to flow through the cooling section 24a and communicating sections 24b and 24c at an approximately fixed flow velocity, without reducing the flow velocity. Since the flow rate of the coolant flowing between the plurality of heat dissipating fins 24f is not reduced, a reduction in the cooling capability is prevented.

The above-described semiconductor device 1 includes the semiconductor modules 10 each including the insulated circuit substrate 11 and the semiconductor chips 12 mounted on the insulated circuit substrate 11, and the cooling device 20 including the top plate 21 having the front surface on which the semiconductor modules 10 are disposed and the rear surface having the sidewall connection region 22a to which the sidewall 22 is connected in a loop shape. The top plate 21 is rectangular in plan view and has the cooling region 21b and communicating regions 21c and 21d set on the rear surface thereof, the cooling region 21b extending in the long-side direction at the central portion of the rear surface of the top plate 21 and being where the plurality of heat dissipating fins 24f are disposed, the communicating regions 21c and 21d being set on both sides of the cooling region 21b in the short-side direction. The sidewall connection region 22a is set on the rear surface of the top plate 21 in a loop shape so as to surround the cooling region 21b and communicating regions 21c and 21d, and the thickness T2 in the cooling region 21b of the top plate 21 is thinner than the thickness T1 in the outer edge regions 21e and 21f of the top plate 21 located outside the sidewall connection region 22a. This achieves a short distance from the front surface of the top plate 21 in the cooling region 21b to the plurality of heat dissipating fins 24f. This also facilitates the transfer of heat from the semiconductor modules 10 to the plurality of heat dissipating fins 24f and thus improves the cooling performance using the coolant. As a result, it is possible to prevent a reduction in the reliability of the semiconductor device 1.

In the above-described cooling device 20, the thickness in the communicating regions 21c and 21d of the top plate 21 is made thinner, so as to improve the cooling performance of the cooling device 20 and prevent a reduction in the reliability of the semiconductor device 1. The following describes variations in the thickness in the communicating regions 21c and 21d of the top plate 21. In this connection, semiconductor devices 1 that will be described in the variations have the same configuration as the above-described semiconductor device 1, except the thickness in the communicating regions 21c and 21d of the top plate 21 in the cooling device 20. Only the differential features will mainly be descried in the variations.

Figure 6:
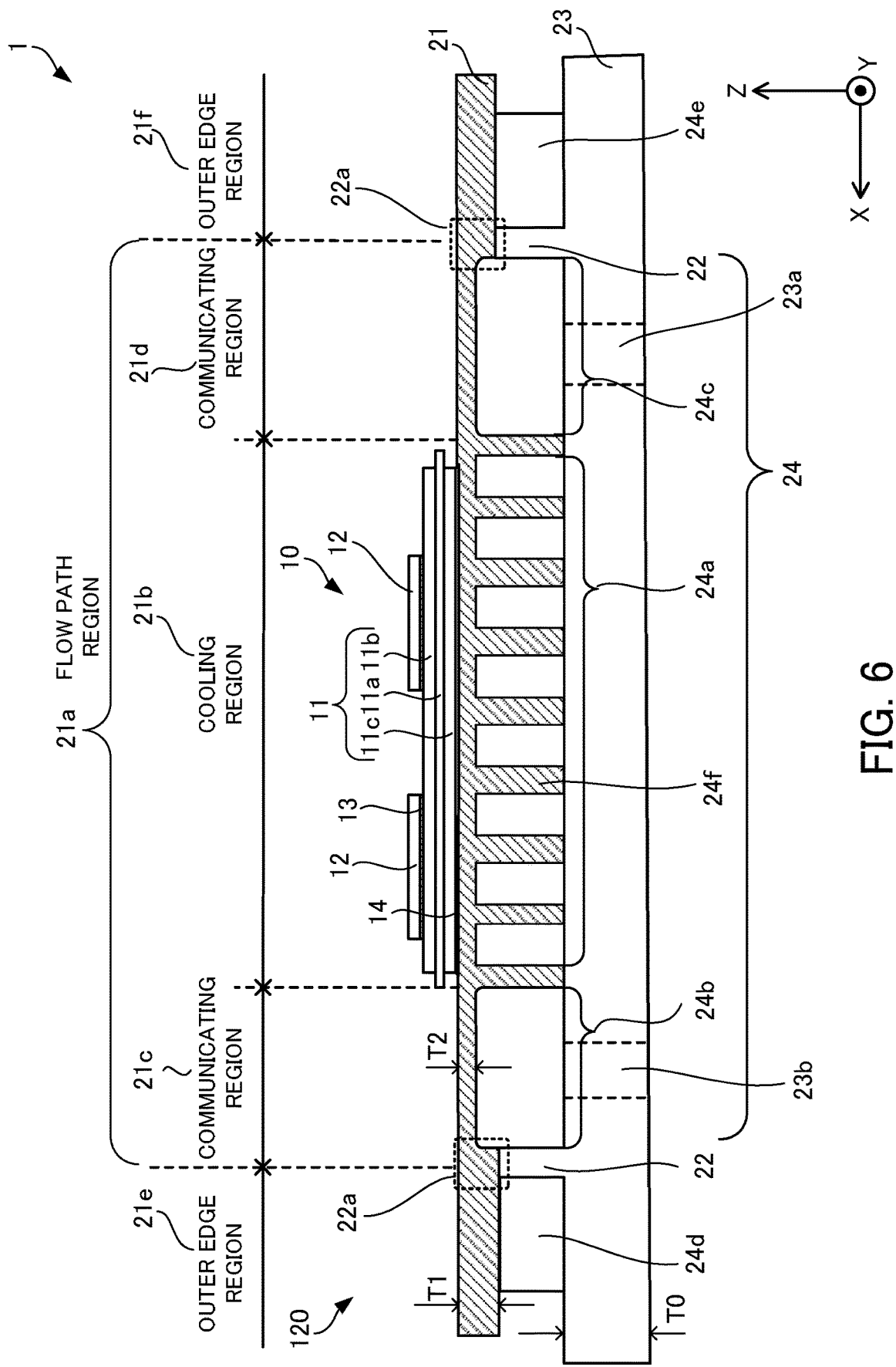
FIG. 6 is a sectional view of another cooling device included in the semiconductor device according to the first embodiment.

In this connection, in the above-described cooling device 20, the top plate 21, the sidewall 22 connected in a loop shape to the rear surface of the top plate 21, and the bottom plate 23 that is connected to the bottom surface of the sidewall 22 so as to face the top plate 21 are integrally included as one unit. The cooling device 20 does not necessarily have such a configuration. Another example of the cooling device 20 will be described with reference to FIG. 6. FIG. 6 is a sectional view of another cooling device included in the semiconductor device according to the first embodiment. In this connection, FIG. 6 is a sectional view of a cooling device 120, which corresponds to the sectional view of FIG. 4.

The cooling device 120 as well includes a top plate 21, a sidewall 22 connected in a loop shape to the rear surface of the top plate 21, and a bottom plate 23 that is connected to the bottom surface of the sidewall 22 so as to face the top plate 21. In this cooling device 120, the sidewall 22 and the bottom plate 23 are integrally formed, separately. The cooling device 120 is formed by separately attaching the bottom plate 23 formed with the sidewall 22 to the top plate 21, which has been described with reference to FIGS. 2 to 4. In this connection, the bottom plate 23 with the sidewall 22 is attached to the top plate 21 by attaching the sidewall 22 to a sidewall connection region 22a of the top plate 21 located at the sides of the outer edge regions 21e and 21f facing the communicating regions 21c and 21d. An entire area to which the sidewall 22 is connected in a loop shape is set as the sidewall connection region 22a on the rear surface of the top plate 21. That is, the sidewall connection region 22a of the top plate 21 and the sidewall 22 correspond to the same position in plan view.

For example, the semiconductor device 1 including the above-described cooling device 120 is shipped under the condition where the semiconductor modules 10 are bonded to the top plate 21 formed with the plurality of heat dissipating fins 24f. Then, at the shipping destination, the bottom plate 23 formed with the sidewall 22 is attached to the top plate 21 having bonded thereto the semiconductor modules 10. At this time, the sidewall 22 is connected to the sidewall connection region 22a of the top plate 21. By doing so, the semiconductor device 1 including the cooling device 120 is obtained.

The following describes variations of the cooling device 20 included in the semiconductor device 1 of the first embodiment. Here, the description is made using the cooling device 20 as an example. In addition, the following variations are applicable to the cooling device 120 illustrated in FIG. 6 and provide the same effects.

(Variation 1-1)

Figure 7:
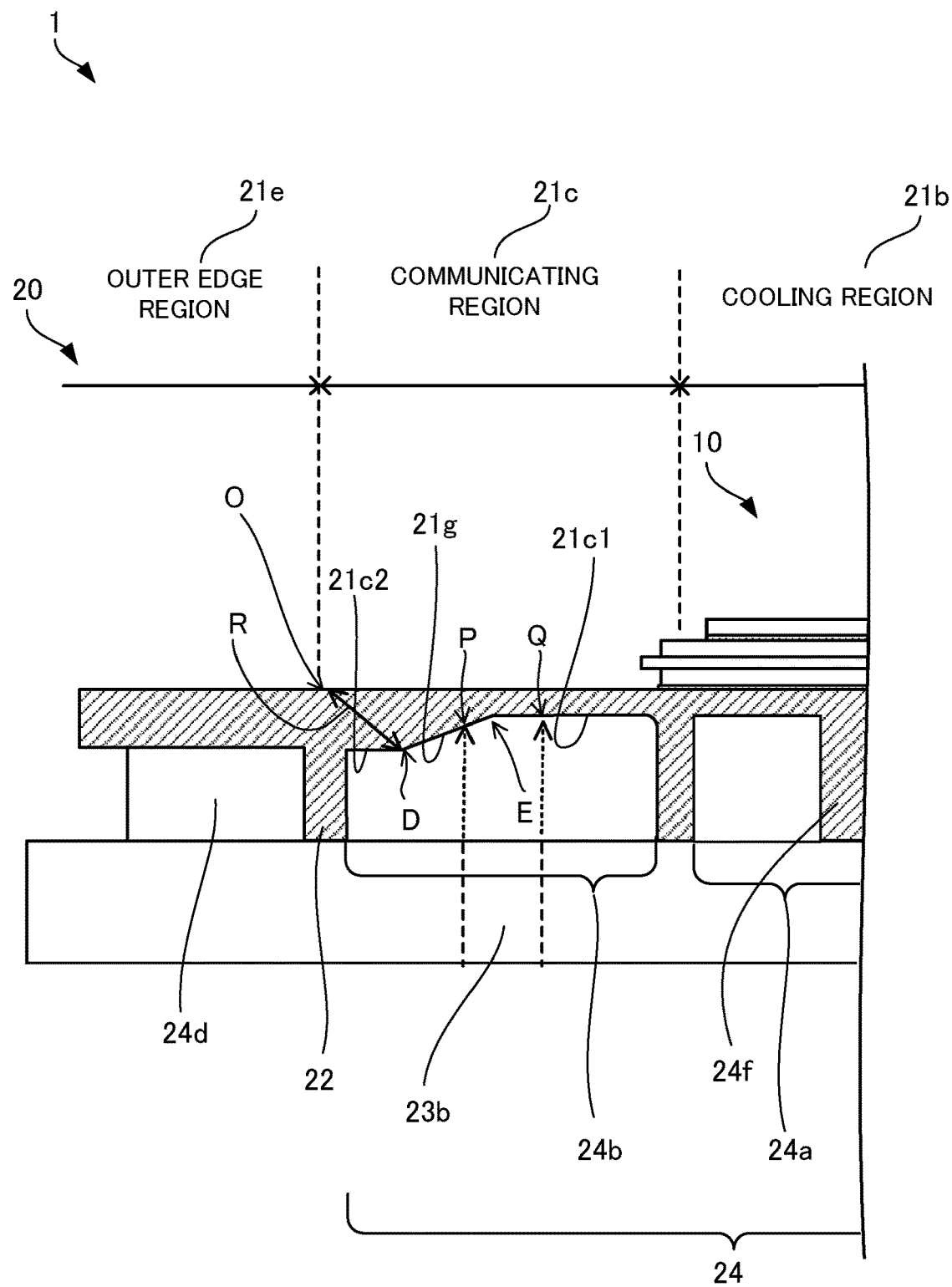
FIG. 7 is a sectional view of a main part of a cooling device included in a semiconductor device according to variation 1-1 of the first embodiment.
Figure 8:
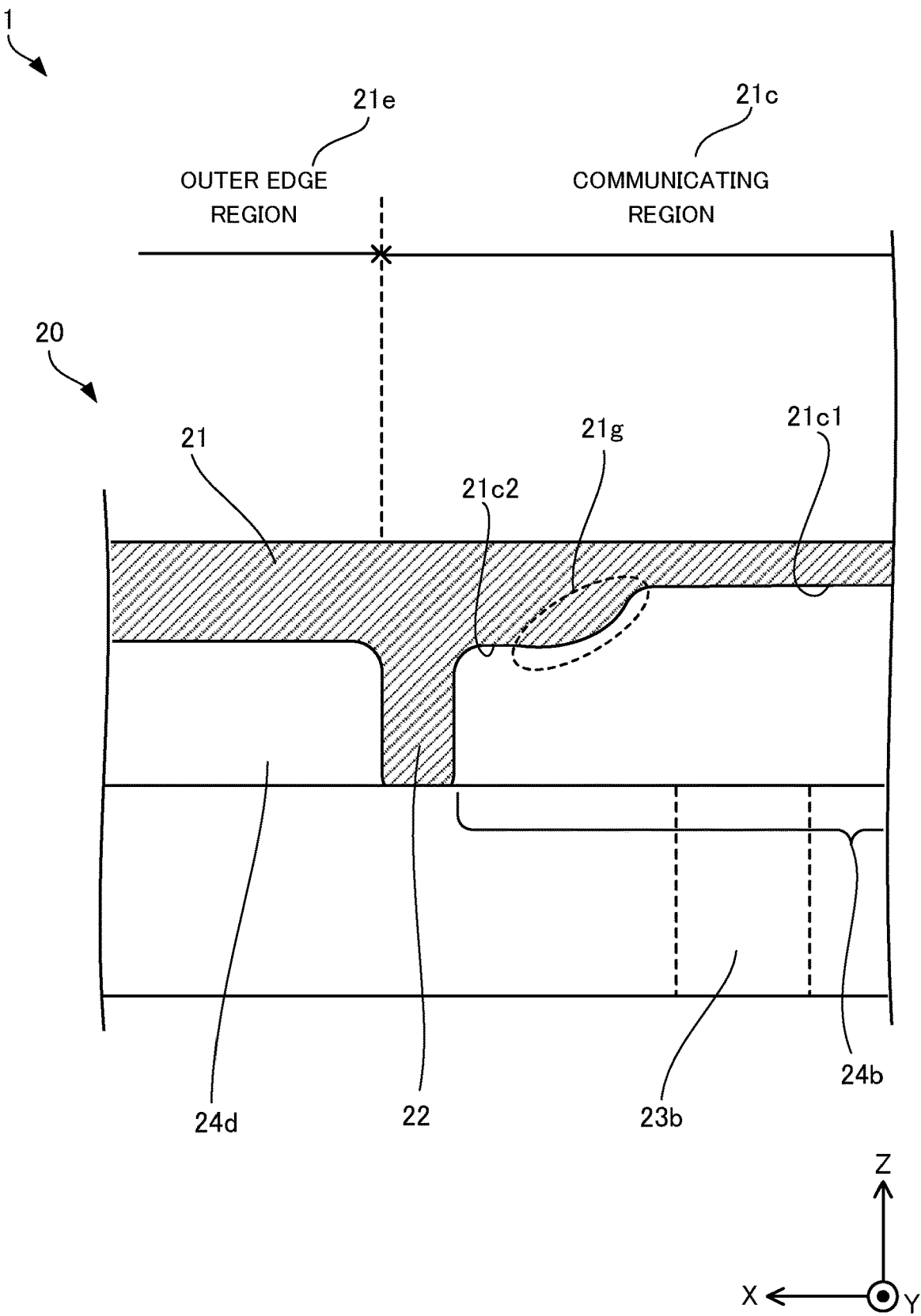
FIG. 8 is an enlarged sectional view of the main part of the cooling device included in the semiconductor device according to variation 1-1 of the first embodiment.

A cooling device 20 according to variation 1-1 will be described with reference to FIGS. 7 and 8. FIG. 7 is a sectional view of a main part of a cooling device included in a semiconductor device according to variation 1-1 of the first embodiment, and FIG. 8 is an enlarged sectional view of the main part of the cooling device included in the semiconductor device according to variation 1-1 of the first embodiment. In this connection, FIG. 7 illustrates an enlarged view of the communicating region 21c of the top plate 21 of FIG. 4 and its surroundings. FIG. 8 illustrates a further enlarged view of FIG. 7. In the following variations, the communicating region 21c of the top plate 21 will be described, and the description of the communicating region 21d will be omitted. Note that the configuration of the communicating region 21c of the top plate 21 may be applicable to the communicating region 21d thereof.

In variation 1-1, the thickness of the top plate 21 in the communicating region 21c is greater in an outer edge region-side portion 21c2 located adjacent to the outer edge region 21e than in a cooling region-side portion 21c1 located adjacent to the cooling region 21b. The thickness of the outer edge region-side portion 21c2 of the top plate 21 is equal to the thickness T1 in the outer edge region 21e of the top plate 21. The thickness of the cooling region-side portion 21c1 of the top plate 21 is equal to the thickness T2 in the cooling region 21b of the top plate 21.

The outer edge region-side portion 21c2 and the cooling region-side portion 21c1 of the top plate 21 are connected to each other with a stepped portion 21g. The stepped portion 21g is beveled for the connection. Here, the stepped portion 21g preferably has an inclination angle of 10 degrees to 45 degrees, inclusive, and more preferably 20 degrees to 30 degrees, inclusive, with respect to the front surface (the X-Y plane) of the top plate 21 in the communicating region 21c. The thickness in the communicating region 21c of the top plate 21 increases from the thickness T2 of the cooling region-side portion 21c1 to the thickness T1 of the outer edge region-side portion 21c2 at the stepped portion 21g, in the direction from the cooling region 21b toward the outer edge region 21e. The stepped portion 21g is formed on the rear surface of the top plate 21 and has the height (the length in the Z direction) calculated by subtracting the thickness T2 of the cooling region-side portion 21c1 from the thickness T1 of the outer edge region-side portion 21c2. The height (T1-T2) of the stepped portion 21g may be at least 0.4 times but 0.6 times or less the thickness T1 of the outer edge region-side portion 21c2. For example, the height (T1-T2) of the stepped portion 21g may be in the range of 0.8 mm to 3.2 mm, inclusive. The length (the length in the direction parallel to the front surface of the top plate 21, the length in the X direction) of the stepped portion 21g may be at least 1.0 times but 5.0 times or less, and more preferably at least 1.7 times but 2.8 times or less the height of the stepped portion 21g.

In the communicating section 24b of the cooling device 20 illustrated in FIG. 4, the top plate 21 and the sidewall 22 are joined together at approximately right angle. Coolant flowing through this communicating section 24b may stay at this corner. If the coolant stays in a predetermined portion in the cooling device 20, this position where the coolant stays become corroded, which increases a possibility of developing a hole. Especially, since the thickness T2 in the communicating region 21c of the top plate 21 is thinner than the thickness T1 in the outer edge region 21e of the top plate 21, the time to develop a hole due to corrosion in the communicating region 21c may be shorter.

In variation 1-1, the thickness of the top plate 21 in the communicating region 21c is greater in the outer edge region-side portion 21c2 located adjacent to the outer edge region 21e than in the cooling region-side portion 21c1 located adjacent to the cooling region 21b. This makes it possible to prolong the time to develop a hole due to corrosion, even when the coolant stays at the connecting portion of the top plate 21 and the sidewall 22 in the communicating region 21c. That is, a hole is less likely to be developed at the connection portion of the top plate 21 and the sidewall 22 in the communicating region 21c.

As illustrated in FIG. 7, assume that, in side view, the intersection point of the top plate 21 and the sidewall 22 is taken as an intersection point O, the intersection point of the outer edge region-side portion 21c2 and the stepped portion 21g is taken as an intersection point D, the intersection point of the cooling region-side portion 21c1 and the stepped portion 21g is taken as an intersection point E, a position on the top plate 21 corresponding to the edge of the outlet 23b (or inlet 23a) closest to the outer edge region 21e (or outer edge region 21f) is taken as a point P, and a position on the top plate 21 corresponding to the edge of the outlet 23b (or inlet 23a) closest to the cooling region 21b is taken as a point Q. As illustrated in FIG. 7, the outer edge region-side portion 21c2 is desirably formed such that the length R from the intersection point O of the top plate 21 and the sidewall 22 to the intersection point D is equal to the thickness T1 in the outer edge region 21e of the top plate 21, or is greater than or equal to the thickness T1. Therefore, the intersection point D of the outer edge region-side portion 21c2 may be located between the sidewall 22 and the point P. In addition, the intersection point E of the cooling region-side portion 21c1 may be located between the point P and point Q corresponding to the outlet 23b (or inlet 23a). By doing so, a part of the stepped portion 21g is positioned so as to correspond to the outlet 23b (or inlet 23a), which facilitates a flow of the coolant through the outlet 23b (or inlet 23a) and the cooling region 21b. On the other hand, as described earlier, the thickness T2 in the communicating region 21c and cooling region 21b of the top plate 21 may be made thinner than the thickness T1 in the outer edge region 21e of the top plate 21, so as to reduce the pressure loss of the coolant flowing through the cooling section 24a and communicating sections 24b and 24c. Therefore, in the top plate 21, the stepped portion 21g may be formed at the edge of the sidewall 22, so as to maximize the length of the cooling region-side portion 21c1.

In addition, the connection portion of the outer edge region-side portion 21c2 and the stepped portion 21g may be rounded as illustrated in FIG. 8. In this connection, FIG. 8 illustrates the case where the stepped portion 21g, as well as the connection portion of the outer edge region-side portion 21c2 and the stepped portion 21g, is rounded. To round the connection portion makes it possible to maximize the cross section of the communicating section 24b while maintaining the length R of FIG. 7. That is, by positioning the outer edge region-side portion 21c2 of the top plate 21 at the edge of the sidewall 22 and forming an R surface at the connection portion of the outer edge region-side portion 21c2 and the stepped portion 21g, the pressure loss of the coolant flowing through the communicating section 24b is maintained low, and a hole becomes less likely to be developed in the communicating section 24b.

Thus, as in the cooling device 20 of FIG. 4, the cooling device 20 of variation 1-1 is able to improve the cooling performance and further prevent a reduction in the reliability of the cooling device 20.

(Variation 1-2)

Figure 9:
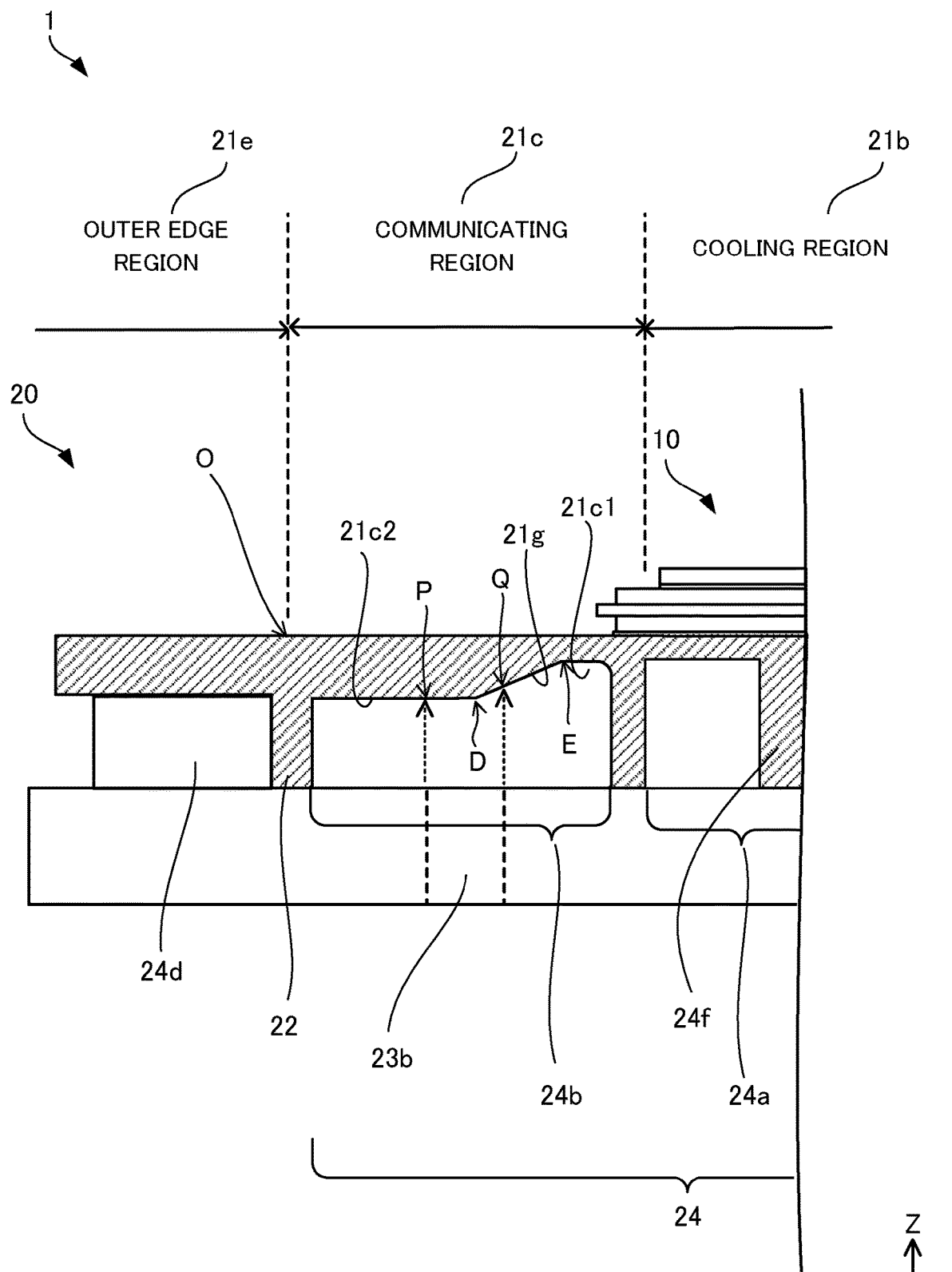
FIG. 9 is a sectional view of a main part of a cooling device included in a semiconductor device according to variation 1-2 of the first embodiment.

A cooling device 20 of variation 1-2 will be described with reference to FIG. 9. FIG. 9 is a sectional view of a main part of a cooling device included in a semiconductor device according to variation 1-2 of the first embodiment. In this connection, FIG. 9 is an enlarged view of the communicating region 21c of the top plate 21 of FIG. 4 and its surroundings.

In variation 1-2, variation 1-1 is further modified so that the stepped portion 21g is formed in the vicinity of the cooling region 21b in the top plate 21. More specifically, the outer edge region-side portion 21c2 of the top plate 21 extends closer to the cooling region 21b than the outer edge region-side portion 21c2 of variation 1-1. In addition, the cooling region-side portion 21c1 of the top plate 21 is shorter than the cooling region-side portion 21c1 of variation 1-1.

Foreign substances such as dusts, air, bubbles, and others may get into the cooling devices 20 of FIGS. 4 and 7. Such foreign substances in the cooling devices 20 may prevent the flow of coolant, which may lead to reducing the flow velocity and thus reducing the cooling performance.

In variation 1-2, the outer edge region-side portion 21c2 of the top plate 21 extends closer to the cooling region 21b than the outer edge region-side portion 21c2 of variation 1-1. Thereby, the communicating section 24b is smaller in cross section than that of each cooling device 20 of FIGS. 4 and 7. That is, the flow velocity of the coolant flowing through the communicating section 24b increases, and the pressure of the coolant increases accordingly. This facilitates discharging of the foreign substances existing in the communicating section 24b together with the coolant from the outlet 23b. In addition, in variation 1-2 as well, the top plate 21 has the thickness T1 in the vicinity of the sidewall 22. Therefore, a hole is less likely to be developed even if the coolant stays at the connection portion of the top plate 21 and the sidewall 22 in the communicating region 21c.

As in the case of FIG. 7, as illustrated in FIG. 9, assume that, in side view, the intersection point of the top plate 21 and the sidewall 22 is taken as an intersection point O, the intersection point of the outer edge region-side portion 21c2 and the stepped portion 21g is taken as an intersection point D, the intersection point of the cooling region-side portion 21c1 and the stepped portion 21g is taken as an intersection point E, a position on the top plate 21 corresponding to the edge of the outlet 23b (or inlet 23a) closest to the outer edge region 21e (or outer edge region 21f) is taken as a point P, and a position on the top plate 21 corresponding to the edge of the outlet 23b (or inlet 23a) closest to the cooling region 21b is taken as a point Q. If the cooling region-side portion 21c1 is too short (in the X direction), i.e., the stepped portion 21g is formed too close to the cooling region 21b in the top plate 21, the thermal conductivity of the top plate 21 in the cooling region 21b may be reduced. However, in variation 1-2, the length of the cooling region-side portion 21c1 from the cooling region 21b is equal to the thickness T2 in the cooling region 21b of the top plate 21, or is greater than the thickness T2, as illustrated in FIG. 9. For example, in the top plate 21, the intersection point E of the cooling region-side portion 21c1 may be located between the cooling region 21b and the point Q. If the cooling region-side portion 21c1 extends beyond the point Q, the top plate 21 over the outlet 23b has the thickness T2, and in this case the flow velocity of the coolant flowing above the outlet 23b is probably not sufficiently high. To deal with this, the intersection point E of the cooling region-side portion 21c1 of the top plate 21 is located between the cooling region 21b and the point Q, so as to increase the flow velocity of the coolant reliably. In addition, the intersection point D of the outer edge region-side portion 21c2 may be located between the point P and point Q corresponding to the outlet 23b (or inlet 23a). By doing so, a part of the stepped portion 21g is positioned so as to correspond to the outlet 23b (or inlet 23a), which further facilitates the flow of the coolant flowing through the outlet 23b (or inlet 23a) and the cooling region 21b.

Thus, the cooling device 20 of variation 1-2 is less likely to have a hole in the communicating section 24b, and is able to discharge foreign substances to the outside and improve the cooling performance, which further prevents a reduction in the reliability of the cooling device 20.

(Variation 1-3)

Figure 10:
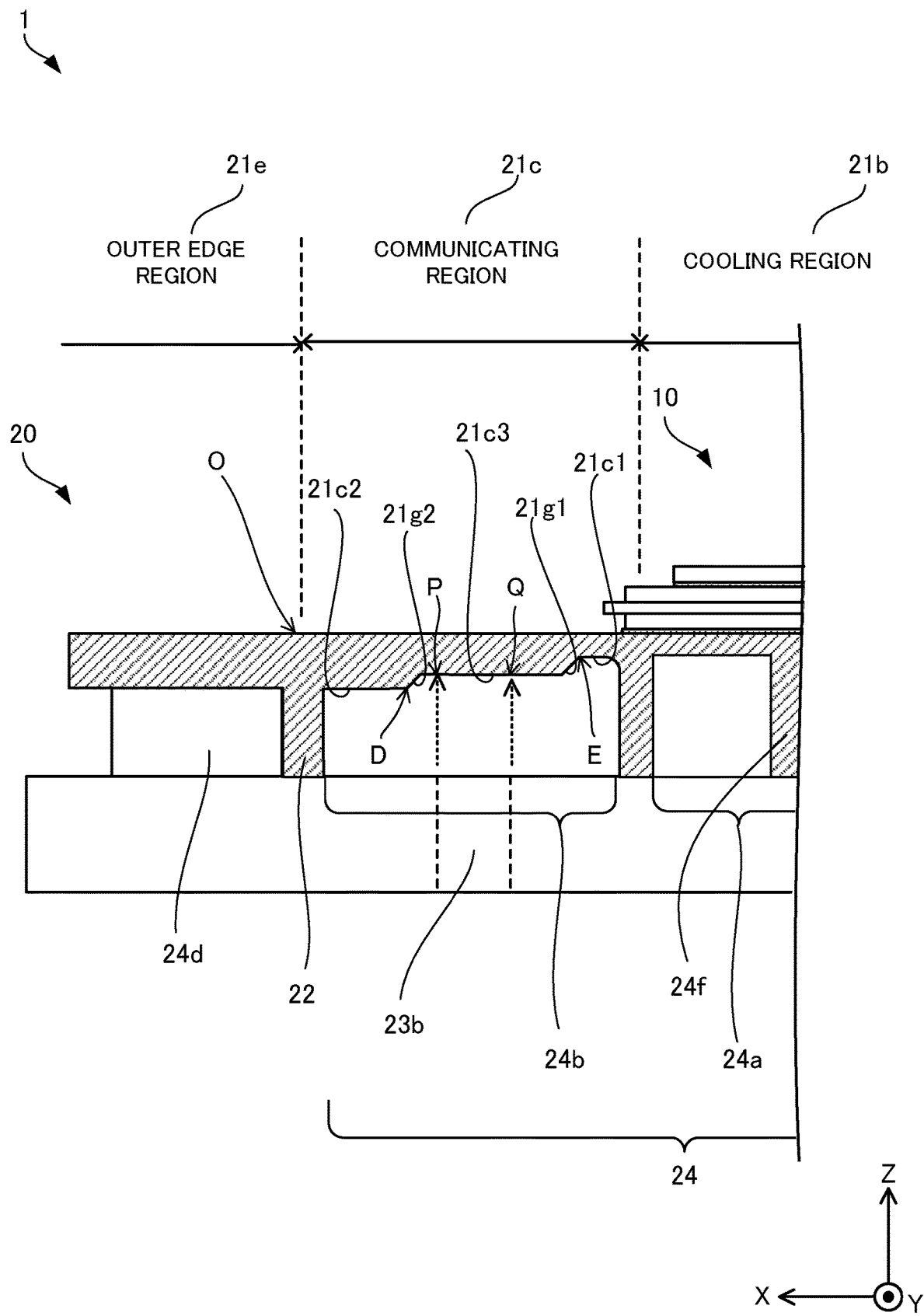
FIG. 10 is a sectional view of a main part of a cooling device included in a semiconductor device according to variation 1-3 of the first embodiment.

A cooling device 20 according to variation 1-3 will be described with reference to FIG. 10. FIG. 10 is a sectional view of a main part of a cooling device included in a semiconductor device according to variation 1-3 of the first embodiment. In this connection, FIG. 10 illustrates an enlarged view of the communicating region 21c of the top plate 21 of FIG. 4 and its surroundings. In addition, as in the case of FIG. 6, as illustrated in FIG. 10, assume that, in side view, the intersection point of the top plate 21 and the sidewall 22 is taken as an intersection point O, a position on the top plate 21 corresponding to the edge of the outlet 23b (or inlet 23a) closest to the outer edge region 21e (or outer edge region 21f) is taken as a point P, and a position on the top plate 21 corresponding to the edge of the outlet 23b (or inlet 23a) closest to the cooling region 21b is taken as a point Q.

In the cooling device 20 of variation 1-3, two stepped portions 21g1 and 21g2 are formed in the top plate 21 in the communicating region 21c. More specifically, in the cooling device 20 of variation 1-3, the thickness in the communicating region 21c of the top plate 21 increases, starting with a cooling region-side portion 21c1, in a middle portion 21c3 and an outer edge region-side portion 21c2 at each of the stepped portions 21g1 and 21g2, in the direction from the cooling region 21b toward the outer edge region 21e. The cooling region-side portion 21c1 of the top plate 21 has the thickness T2, and the outer edge region-side portion 21c2 has the thickness T1. The thickness of the middle portion 21c3 is greater than the thickness T2 and thinner than the thickness T1. The intersection point of the outer edge region-side portion 21c2 and the stepped portion 21g2 closest to the outer edge region 21e is taken as an intersection point D, and the intersection point of the cooling region-side portion 21c1 and the stepped portion 21g1 closest to the cooling region 21b is taken as an intersection point E.

As in variation 1-1, the cooling device 20 of variation 1-3 is less likely to have a hole due to corrosion. In addition, the cooling device 20 of variation 1-3 is smaller in the cross section of the communicating section 24b than the cooling device 20 of variation 1-1. Therefore, the cooling device 20 of variation 1-3 is able to eliminate foreign substances from inside and improve the cooling performance, compared with the cooling device 20 of variation 1-1.

In addition, the cooling device 20 of variation 1-3 is larger in the cross section of the communicating section 24b than the cooling device 20 of variation 1-2. Therefore, the cooling device 20 of variation 1-3 is able to reduce the pressure loss of coolant flowing through the communicating section 24b and improve the cooling performance, compared with the cooling device 20 of variation 1-2.

Therefore, the cooling device 20 of variation 1-3 is less likely to have a hole due to corrosion and is able to eliminate foreign substances, reduce the pressure loss of the coolant, and improve the cooling performance, which further prevents a reduction in the reliability of the cooling device 20.

In this connection, in the cooling device 20 of variation 1-3, the middle portion 21c3 of the top plate 21 preferably corresponds to the outlet 23b (or inlet 23a) in side view. That is, at least a part of the middle portion 21c3 may be placed between the point P and point Q corresponding to the outlet 23b (or inlet 23a). The stepped portion 21g1 of the top plate 21 preferably corresponds to a position closer to the cooling region 21b than the outlet 23b in side view. That is, in the top plate 21, the intersection point E of the stepped portion 21g1 is located at a position closer to the cooling region 21b than the point Q corresponding to the edge of the outlet 23b closest to the cooling region 21b in side view. In addition, the intersection point D of the stepped portion 21g2 is preferably located at a position closer to the outer edge region 21e than the point P corresponding to the edge of the outlet 23b closest to the outer edge region 21e. By doing so, it is possible to increase the flow velocity of the coolant flowing over the outlet 23b reliably, as compared with variation 1-1.

In addition, variation 1-3 relates to the case where the two stepped portions 21g1 and 21g2 are provided in the top plate 21 in the communicating region 21c, and three portions with different heights are formed by the stepped portions 21g1 and 21g2. The configuration is not limited to this, but three or more stepped portions may be provided, and four or more portions with different heights may be formed by these stepped portions.

Second Embodiment

Figure 11:
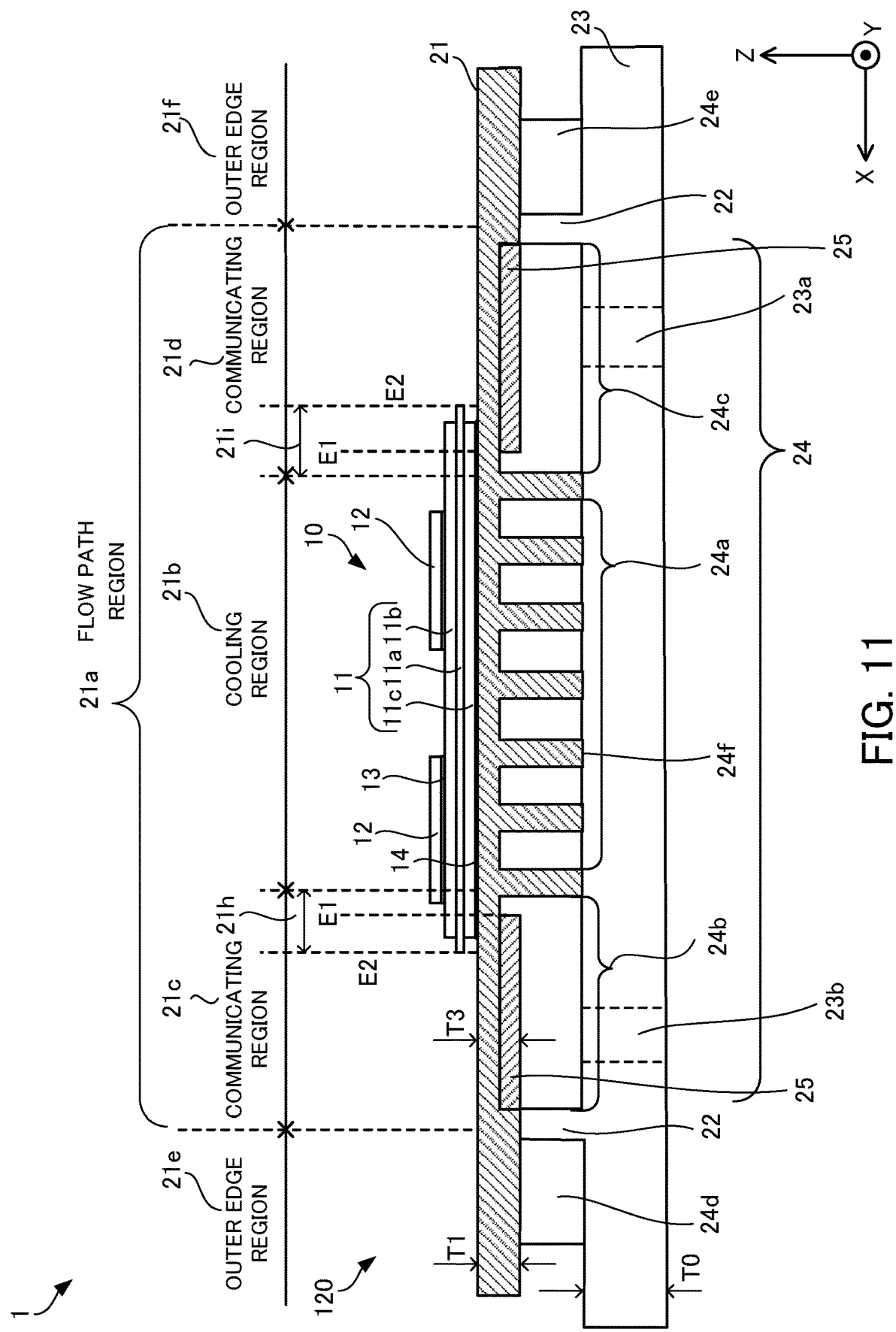
FIG. 11 is a sectional view of a cooling device included in a semiconductor device according to a second embodiment.
Figure 12:
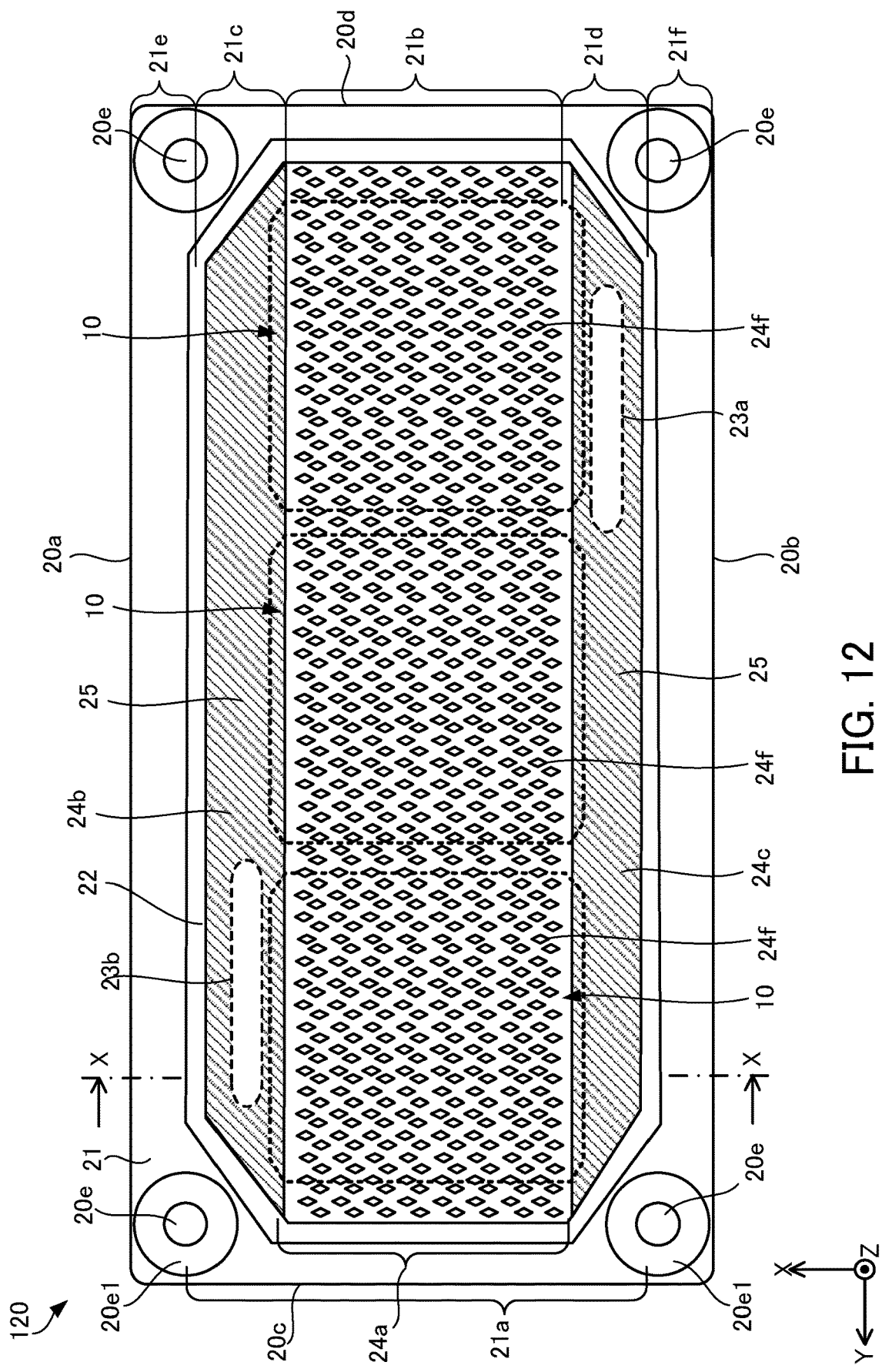
FIG. 12 is a plan view of the cooling device included in the semiconductor device according to the second embodiment.

In a second embodiment, a semiconductor device 1 will be described with reference to FIGS. 11 and 12, in which semiconductor modules 10 are disposed on a top plate 21 beyond a cooling region 21b where heat dissipating fins 24f are provided. FIG. 11 is a sectional view of a cooling device included in the semiconductor device according to the second embodiment. FIG. 12 is a plan view of the cooling device included in the semiconductor device according to the second embodiment. In addition, the semiconductor device 1 of the second embodiment will be described using the cooling device 120 that has been described with reference to FIG. 6. The cooling device 20 described with reference to FIG. 4 is applicable to the semiconductor device 1 of the second embodiment in the same manner.

To reduce the size of the semiconductor device 1, the size of the cooling region 21b is preferentially reduced while the sizes of the semiconductor modules 10 are maintained. When the size of the cooling region 21b having the heat dissipating fins 24f is reduced, the semiconductor modules 10 are disposed on the cooling region 21b but have portions projecting beyond the cooling region 21b. That is, there is no heat dissipating fin 24f directly under the projecting portions of the semiconductor modules 10 from the cooling region 21b. In addition, in the thermal cycle test of the semiconductor device 1, a thermal stress is generated due to a difference in linear expansion coefficient between a semiconductor module 10 (the semiconductor chips 12 and insulated circuit substrate 11) and the cooling device 120 (the top plate 21). In this connection, the top plate 21 (for example, aluminum) has a linear expansion coefficient of approximately $2.4 \times 10^{-5}/°C$., and a sealing material (for example, an epoxy resin) has a linear expansion coefficient of approximately $1.4 \times 10^{-5}/°C$.

In the case where the heat dissipating fins 24f do not exist directly under the projecting portions (hereinafter, projecting regions 21h and 21i) of the semiconductor modules 10 from the cooling region 21b, a distortion (change amount) that occurs in the semiconductor device 1 (the cooling device 120) due to the thermal stress increases, as compared with the case where the heat dissipating fins 24*f* exist. As a result, a sealing material sealing the cooling device 120 may peel off from around the insulated circuit substrate 11. This leads to a reduction in the reliability of the semiconductor device 1.

To deal with this, in the cooling device 120 of the semiconductor device 1, relief plates 25 are provided on the rear surface (the surface facing the bottom plate 23) of the top plate 21. The relief plates 25 are formed along the short-side direction of the top plate 21. More specifically, the outer edge of a relief plate 25 (facing the outer edge region 21*e* or 21*f*) is placed on the sidewall 22 of the top plate 21, and the inner edge E1 thereof is located inside the outer edge E2 of the insulated circuit substrate 11 (within a projecting region 21*h* or 21*i*). By providing the relief plates 25 in the projecting regions 21*h* and 21*i* of the semiconductor modules 10 from the cooling region 21*b* in this way, it is possible to relieve the thermal stress on the cooling device 120, which results in preventing a distortion in the cooling device 120 (the semiconductor device 1).

In this connection, the relief plates 25 are disposed in the projecting regions 21*h* and 21*i* in this way, only in the case where the heat dissipating fins 24*f* are not provided in the projecting regions 21*h* and 21*i* of the semiconductor modules 10 from the cooling region 21*b*. In the second embodiment, as illustrated in FIGS. 11 and 12, the semiconductor modules 10 each project beyond both edges (in the ±X directions) of the cooling region 21*b*. Therefore, the relief plates 25 are provided in the projecting regions 21*h* and 21*i* on both sides of the cooling region 21*b*. In the case where the semiconductor modules 10 each project beyond one of edges (in the ±X directions) of the cooling region 21*b*, a relief plate 25 is disposed on the top plate 21 so as to correspond to the projecting region.

The edge E1 of each relief plate 25 may be located in the projecting region 21*h* or 21*i* inside the outer edge E2 of the insulated circuit substrate 11, and may contact with an outermost heat dissipating fin 24*f*. Here, the edge E1 of each relief plate 25 is located apart from (and outside) the outermost heat dissipating fin 24*f* in the projecting region 21*h* or 21*i*. Note that the edges E1 of the relief plates 25 do not enter inside the outermost heat dissipating fins 24*f* (the projecting regions 21*h* and 21*i*). If the edges E1 of the relief plates 25 are located inside the outermost heat dissipating fins 24*f*, the cooling performance in the cooling region 21*b* is reduced.

The present embodiment relates to the case where the layer thickness T3 in the communicating region 21*c* of the relief plate 25 and top plate 21 is equal to the thickness T1. To increase the layer thickness T3 (the thickness of the relief plates 25) further relieves the thermal stress on the cooling device 120. However, the relief plates 25, if too thick, increase the pressure loss of coolant flowing through the cooling section 24*a* and communicating sections 24*b* and 24*c*. In addition, the too thick relief plates 25 decrease the heat dissipation from the front surface of the top plate 21 to the coolant flowing through the communicating regions 21*c* and 21*d*. To deal with this, the thickness of the relief plates 25 may be selected so that the layer thickness T3 is equal to the maximum thickness T1.

The second embodiment describes an example in which the relief plates 25 are separately attached to the top plate 21. Alternatively, the relief plates 25 may be integrally formed with the top plate 21 in the communicating regions 21*c* and 21*d*.

The following describes variations of the relief plates 25 included in the cooling device 120 of the semiconductor device 1 of the second embodiment. Here, the variations will be described using the cooling device 120 as an example. In addition, the variations are applicable to the cooling device 20 of FIG. 4 and provide the same effects.

(Variation 2-1)

Figure 13:
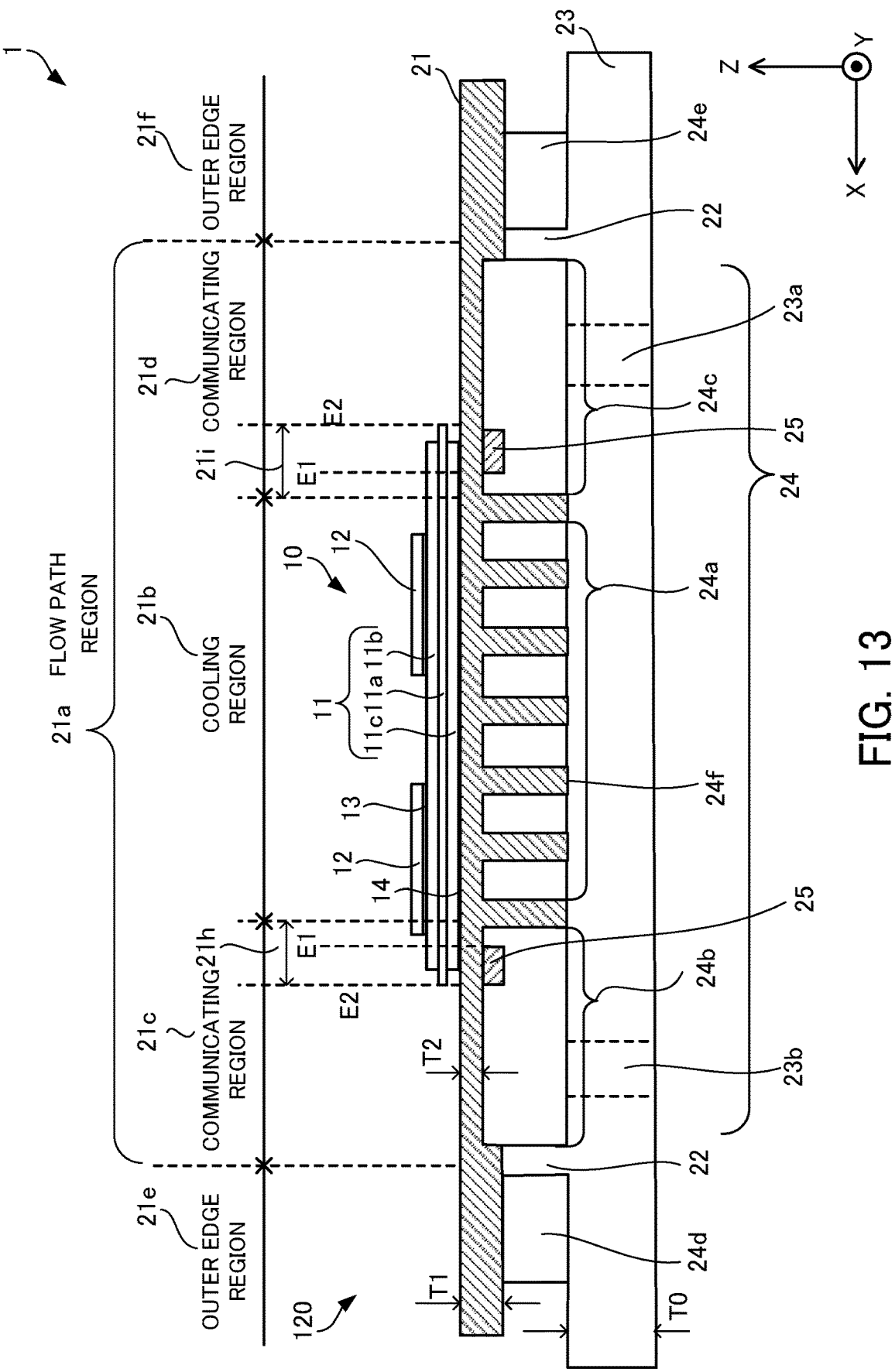
FIG. 13 is a sectional view of a cooling device included in a semiconductor device according to variation 2-1 of the second embodiment.
Figure 14:
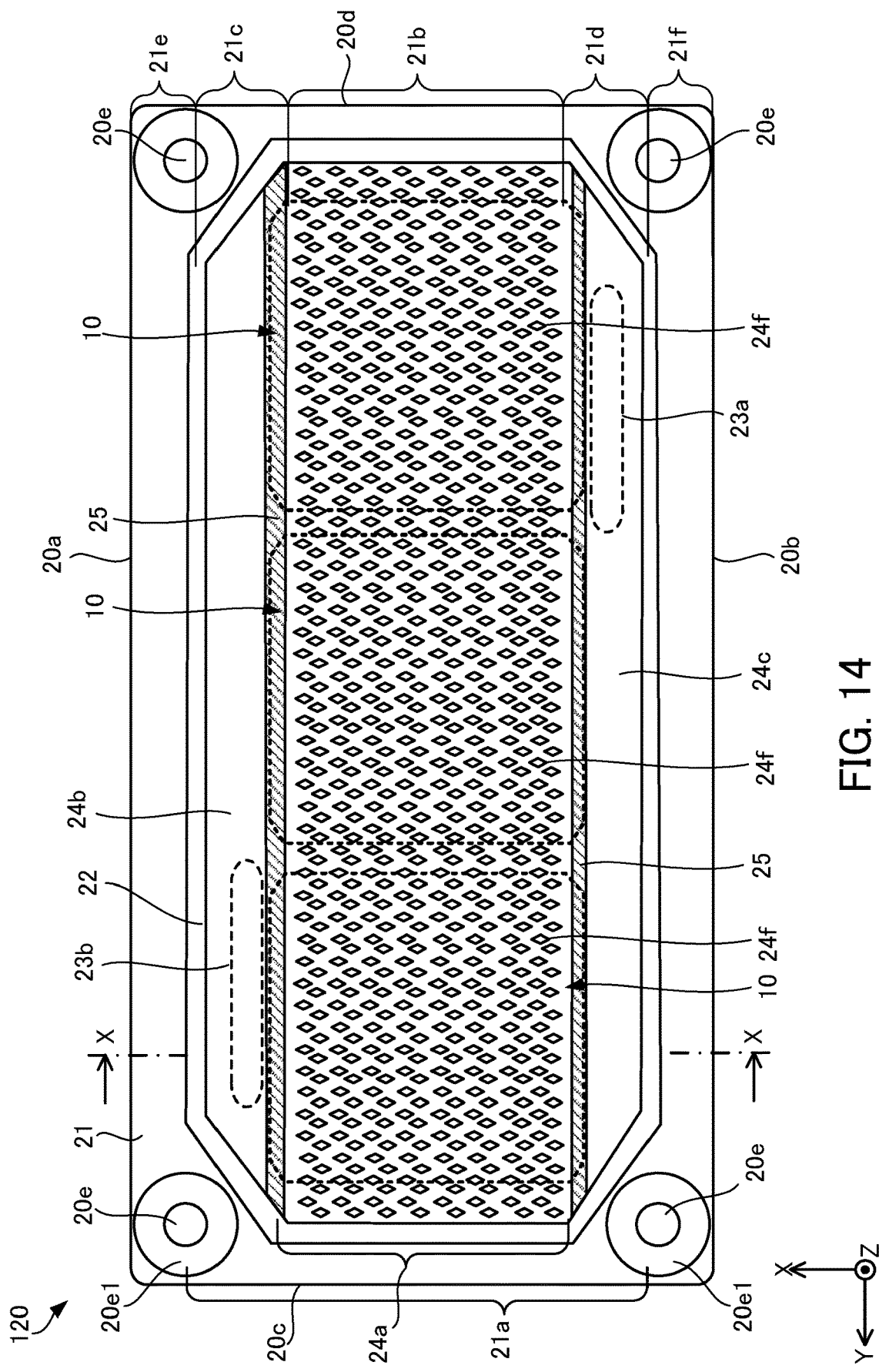
FIG. 14 is a plan view of the cooling device included in the semiconductor device according to variation 2-1 of the second embodiment.

A semiconductor device 1 according to variation 2-1 will be described with reference to FIGS. 13 and 14. FIG. 13 is a sectional view of a cooling device included in a semiconductor device according to variation 2-1 of the second embodiment. FIG. 14 is a plan view of the cooling device included in the semiconductor device according to variation 2-1 of the second embodiment.

As described earlier, the relief plates 25 are provided on the rear surface of the top plate 21 so as to extend from the sidewall 22 to the projecting regions 21*h* and 21*i* of the semiconductor modules 10 from the cooling region 21*b*. These relief plates 25 are able to relieve the thermal stress on the cooling device 120 and prevent a distortion in the cooling device 120 (the semiconductor device 1). That is, the relief plates 25 may be formed on the rear surface of the top plate 21 so as to correspond to at least the projecting regions 21*h* and 21*i* of the semiconductor modules 10 from the cooling region 21*b*. For example, as illustrated in FIGS. 13 and 14, relief plates 25 are formed in areas corresponding to the projecting regions 21*h* and 21*i* on the rear surface of the top plate 21. These relief plates 25 as well are able to relieve the thermal stress on the cooling device 120 and prevent a distortion in the cooling device 120 (the semiconductor device 1). In addition, the relief plates 25 do not exist between the outer edge E2 of the insulated circuit substrate 11 and the sidewall 22 on the rear surface of the top plate 21. Therefore, it is possible to prevent an increase in the pressure loss of the coolant flowing through the cooling section 24*a* and communicating sections 24*b* and 24*c*. In addition, it is also possible to prevent a decrease in heat dissipation from the front surface of the top plate 21 to the coolant flowing through the communicating regions 21*c* and 21*d*.

In addition, corners of the relief plates 25 that face the bottom plate 23 may be rounded. This facilitates the flow of the coolant between the cooling section 24*a* and the communicating sections 24*b* and 24*c*. That is, it is possible to maintain the pressure loss of the coolant low, reduce the time period during which the coolant stays due to the relief plates 25, and prolong the time to develop a hole due to corrosion even if the coolant stays. That is, a hole is less likely to be developed at the connection portion of the top plate 21 and each relief plate 25.

In this connection, in variation 2-1, the thickness in the communicating regions 21*c* and 21*d* of the top plate 21 may be changed, as described in variations 1-1, 1-2, and 1-3.

(Variation 2-2)

Figure 15:
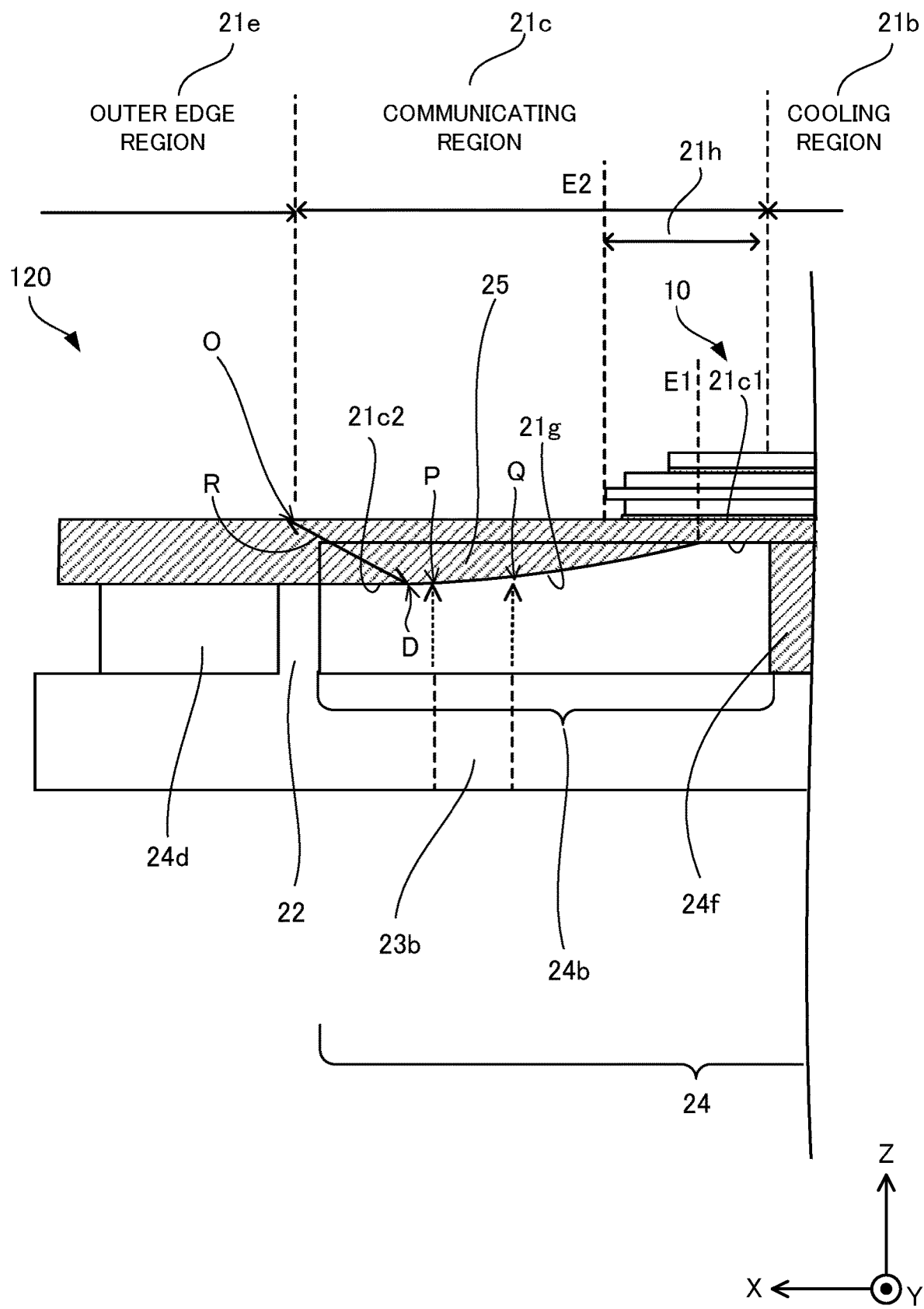
FIG. 15 is a sectional view of a main part of a cooling device included in a semiconductor device according to variation 2-2 of the second embodiment.

A semiconductor device 1 of variation 2-2 will be described with reference to FIG. 15. FIG. 15 is a sectional view of a main part of a cooling device included in a semiconductor device according to variation 2-2 of the second embodiment. In this connection, FIG. 15 corresponds to variation 1-1 (FIG. 7) and variation 1-2 (FIG. 9) and is an enlarged view of a relief plate 25 and its surroundings.

In variation 2-2, the edge of the relief plate 25 facing the outer edge region 21*e* is located at the sidewall 22 on the rear surface of the top plate 21. The edge E1 of the relief plate 25 is located within the projecting region 21*h*. In addition, in variation 2-2, the thickness of the relief plate 25 may vary, as with the top plate 21 of variation 1-2. More specifically, in the relief plate 25 of variation 2-2, the layer thickness in the communicating region 21c of the top plate 21 and relief plate 25 is greater in the outer edge region-side portion 21c2 located adjacent to the outer edge region 21e than in the cooling region-side portion 21c1 located adjacent to the cooling region 21b. The layer thickness of the outer edge region-side portion 21c2 of the top plate 21 and relief plate 25 is equal to the thickness T1 in the outer edge region 21e of the top plate 21. The thickness of the cooling region-side portion 21c1 of the top plate 21 is equal to the thickness T2 in the cooling region 21b of the top plate 21.

The outer edge region-side portion 21c2 of the relief plate 25 and the cooling region-side portion 21c1 are connected to each other with a stepped portion 21g. The stepped portion 21g is beveled for the connection. In this case, the stepped portion 21g preferably has an inclination angle of 10 degrees to 45 degrees, inclusive, and more preferably 20 degrees to 30 degrees, inclusive, with respect to the front surface (the X-Y plane) of the relief plate 25 in the communicating region 21c. The layer thickness in the communicating region 21c of the top plate 21 and relief plate 25 increases from the thickness T2 of the cooling region-side portion 21c1 to the thickness T1 of the outer edge region-side portion 21c2 at the stepped portion 21g, in the direction from the cooling region 21b toward the outer edge region 21e. As in variation 1-1, the stepped portion 21g is formed to have the height (the length in the Z direction) calculated by subtracting the thickness T2 of the cooling region-side portion 21c1 from the thickness T1 of the outer edge region-side portion 21c2. In variation 2-2 as well, the height (T1-T2) of the stepped portion 21g may be at least 0.4 times but 0.6 times or less the thickness T1 of the outer edge region-side portion 21c2. For example, the height (T1-T2) of the stepped portion 21g may be in the range of 0.8 mm to 3.2 mm, inclusive. The length (the length in the direction parallel to the front surface of the top plate 21, the length in the X direction) of the stepped portion 21g may be at least 1.0 times but 5.0 times or less, and more preferably at least 1.7 times but 2.8 times or less the height of the stepped portion 21g.

In variation 2-2 as well, the thicknesses of the top plate 21 and relief plate 25 are set as described above. With this setting, it is possible to prolong the time to develop a hole due to corrosion even if coolant stays at the connection portion of the relief plate 25 and the sidewall 22 in the communicating region 21c of the top plate 21, as in variation 1-1 (FIG. 7). More specifically, a hole is less likely to be developed at the connection portion of the relief plate 25 and the sidewall 22 in the communicating region 21c of the top plate 21.

In addition, in variation 2-2 as well, the outer edge region-side portion 21c2 is desirably formed such that the length R between the intersection point O of the top plate 21 and the sidewall 22 and the intersection point D is equal to the thickness T1 in the outer edge region 21e of the top plate 21, or greater than or equal to the thickness T1 (in this variation, the length R is greater than or equal to the thickness T1), as in variation 1-1 (FIG. 7). Therefore, the intersection point D of the outer edge region-side portion 21c2 may be located between the sidewall 22 and the point P.

In addition, for example, in variation 2-2 as well, in the top plate 21, the edge E1 of the relief plate 25 may be located between the cooling region 21b and the outer edge E2, as in variation 1-2 (FIG. 9). If the cooling region-side portion 21c1 extends beyond the point Q, the top plate 21 over the outlet 23b is thinner than the thickness T1, and in this case the flow velocity of the coolant flowing over the outlet 23b is probably not sufficiently high. To deal with this, the edge E1 of the relief plate 25 is located between the cooling region 21b and the outer edge E2, so as to increase the flow velocity of the coolant reliably.

In addition, in variation 2-2 as well, the connection portion of the outer edge region-side portion 21c2 and the stepped portion 21g may be rounded. To round the connection portion makes it possible to maximize the cross section of the communicating section 24b while maintaining the length R. That is, by positioning the outer edge region-side portion 21c2 of the top plate 21 at the edge of the sidewall 22 and forming an R surface at the connection portion of the outer edge region-side portion 21c2 and the stepped portion 21g, the pressure loss of the coolant flowing through the communicating section 24b is maintained low, and a hole is less likely to be developed in the communicating section 24b.

In addition, although not illustrated, variation 2-2 may be modified so that the stepped portion 21g of the relief plate 25 is formed in the vicinity of the cooling region 21b, as in variation 1-2 (FIG. 9). More specifically, the outer edge region-side portion 21c2 of the relief plate 25 may extend closer to the cooling region 21b than the outer edge region-side portion 21c2 illustrated in FIG. 15. In addition, the cooling region-side portion 21c1 of the top plate 21 is shorter than the cooling region-side portion 21c1 illustrated in FIG. 15. In this case, the communicating section 24b is smaller in cross section than that of the cooling device 120 illustrated FIG. 15. That is, the flow velocity of the coolant flowing through the communicating section 24b increases, and the pressure of the coolant flowing increases. This facilitates discharging of foreign substances existing in the communicating section 24b together with the coolant from the outlet 23b. In addition, in this case as well, the top plate 21 and relief plate 25 have the thickness T1 in the vicinity of the sidewall 22. Thus, a hole is less likely to be developed even if the coolant stays at the connection portion of the relief plate 25 and the sidewall 22 in the communicating region 21c of the top plate 21.

In addition, if the above cooling region-side portion 21c1 is too short (in the X direction) and the stepped portion 21g is too close to the cooling region 21b of the top plate 21, the thermal conductivity of the top plate 21 in the cooling region 21b may decrease. However, in the case where the stepped portion 21g of the relief plate 25 is formed in the vicinity of the cooling region 21b, the length of the cooling region-side portion 21c1 from the cooling region 21b is equal to the thickness T2 in the cooling region 21b of the top plate 21, or longer than the thickness T2. For example, in the top plate 21, the edge E1 of the relief plate 25 may be located between the cooling region 21b and the point Q. If the cooling region-side portion 21c1 extends beyond the point Q, the top plate 21 over the outlet 23b has the thickness T2, and in this case the flow velocity of the coolant flowing above the outlet 23b is probably not sufficiently high. To deal with this, the edge E1 of the relief plate 25 is located between the cooling region 21b and the point Q, so as to increase the flow velocity of the coolant reliably. In addition, the intersection point D of the outer edge region-side portion 21c2 may be located between the point P and point Q corresponding to the outlet 23b (or inlet 23a). By doing so, a part of the stepped portion 21g is positioned so as to correspond to the outlet 23b (or inlet 23a), which further facilitates the flow of the coolant flowing through the outlet 23b (or inlet 23a) and the cooling region 21b.

Thus, compared with the cooling device 120 of FIG. 11, the cooling device 120 of variation 2-2 is able to further improve the cooling performance and further prevent a reduction in the reliability of cooling device 120.

(Variation 2-3)

Figure 16:
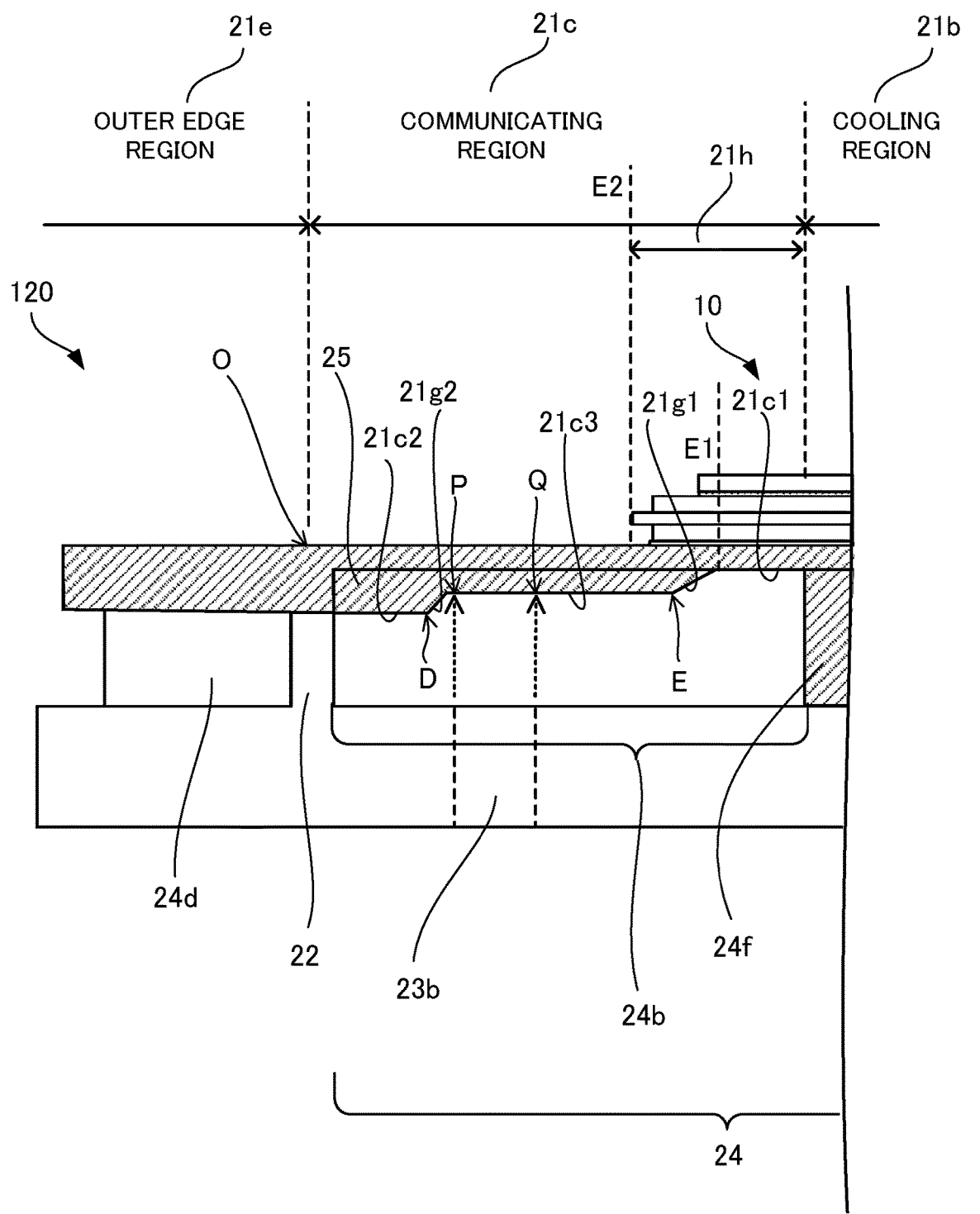
FIG. 16 is a sectional view of a main part of a cooling device included in a semiconductor device according to variation 2-3 of the second embodiment.

A semiconductor device 1 of variation 2-3 will be described with reference to FIG. 16. FIG. 16 is a sectional view of a main part of a cooling device included in a semiconductor device according to variation 2-3 of the second embodiment. In this connection, FIG. 16 corresponds to variation 1-3 (FIG. 10) and is an enlarged view of a relief plate 25 and its surroundings.

In variation 2-3, the thickness of the relief plate 25 varies, as with the top plate 21 of variation 1-3 (FIG. 10). More specifically, variation 2-3 relates to the case where two stepped portions 21g1 and 21g2 are formed in the communicating region 21c of the top plate 21 and relief plate 25, as in variation 1-3 (FIG. 10). In the cooling device 120 of variation 2-3 as well, the thickness of the top plate 21 and relief plate 25 in the communicating region 21c increases, starting with the cooling region-side portion 21c1, in a middle portion 21c3 and an outer edge region-side portion 21c2 at each of the stepped portions 21g1 and 21g2, in the direction from the cooling region 21b toward the outer edge region 21e. The cooling region-side portion 21c1 of the top plate 21 has the thickness T2, and the outer edge region-side portion 21c2 has the thickness T1. The middle portion 21c3 is greater than the thickness T2 and thinner than the thickness T1. Assume that the intersection point of the outer edge region-side portion 21c2 and the stepped portion 21g2 closest to the outer edge region 21e is taken as an intersection point D, and the intersection point of the cooling region-side portion 21c1 and the stepped portion 21g1 closest to the cooling region 21b is taken as an intersection point E.

The cooling device 120 of variation 2-3 described above is less likely to have a hole due to corrosion, as in variation 2-2. In addition, the cooling device 120 of variation 2-3 is smaller in the cross section of the communicating section 24b than the cooling device 120 of variation 2-2. Therefore, the cooling device 120 of variation 2-3 is able to further eliminate foreign substances from inside and further improve the cooling performance, compared with the cooling device 120 of variation 2-2.

In addition, the cooling device 20 of variation 2-3 is larger in the cross section of the communicating section 24b than the case where the stepped portion 21g is formed in the vicinity of the cooling region 21b in the cooling device 120 of variation 2-2. Therefore, the cooling device 120 of variation 2-3 is able to further reduce the pressure loss of the coolant flowing through the communicating section 24b and further improve the cooling performance, as compared with this case of variation 2-2.

Therefore, the cooling device 120 of variation 2-3 is less likely to have a hole due to corrosion, and is able to eliminate foreign substances, reduce the pressure loss of the coolant, and improve the cooling performance, which further prevents a reduction in the reliability of the cooling device 120.

In this connection, in the cooling device 120 of variation 2-3 as well, the middle portion 21c3 of the top plate 21 preferably corresponds to the outlet 23b (or inlet 23a) in side view. By doing so, the cooling device 120 of variation 2-3 is able to increase the flow velocity of the coolant flowing above the outlet 23b reliably, as compared with variation 2-2.

In addition, variation 2-3 relates to the case where the two stepped portions 21g1 and 21g2 are formed in the relief plate 25 in the communicating region 21c, and three portions with different heights are formed by the stepped portions 21g1 and 21g2. The configuration is not limited to this case, and three or more stepped portions may be formed, and four or more portions with different heights may be formed by these stepped portions.

Figure 17:
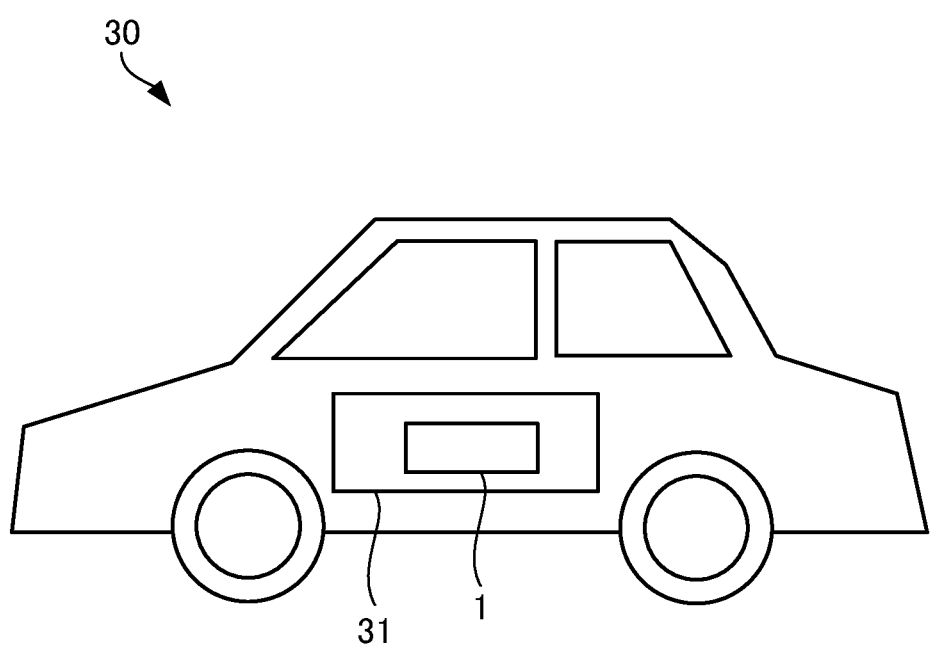
FIG. 17 schematically illustrates a vehicle.

By the way, as an example of an apparatus provided with a semiconductor device 1 of the first and second embodiments, a vehicle will be described with reference to FIG. 17. FIG. 17 schematically illustrates a vehicle. The vehicle 30 generates at least part of driving force using power. As an example, the vehicle 30 is an electric car that generates all driving force with a power driving device such as a motor, or a hybrid car that uses both a power driving device such as a motor and an internal combustion engine that drives with fuels such as gasoline or the like.

The vehicle 30 includes a control device 31 (external device) that controls the power driving device such as a motor. The control device 31 is provided with the semiconductor device 1. The semiconductor device 1 may be designed to control power to be supplied to the power driving device.

The following describes an equivalent circuit included in the semiconductor device 1, with reference to FIG. 18. FIG. 18 illustrates an equivalent circuit included in a semiconductor device. The semiconductor devices 1 of the first and second embodiments each may function as a three-phase invertor circuit with output terminals U, V, and W and form a part of an automotive unit that drives the motor of the vehicle 30.

In this connection, FIG. 18 illustrates the case where semiconductor chips 12c1 to 12c6 included in the semiconductor device 1 are each an RC-IGBT that includes the functions of the semiconductor chips 12a1 to 12a6 and 12b1 to 12b6 illustrated in FIG. 1.

In the semiconductor device 1, the semiconductor chips 12c1, 12c2, and 12c3 may form an upper arm, and the semiconductor chips 12c4, 12c5, and 12c6 may form a lower arm. The semiconductor chips 12c1 and 12c4 as a combination may form a leg (W phase), and likewise, the semiconductor chips 12c2 and 12c5 as a combination and the semiconductor chips 12c3 and 12c6 as a combination may form legs (V phase and U phase).

The emitter electrode of the semiconductor chip 12c6 may be electrically connected to the input terminal N1, and the collector electrode thereof may be electrically connected to the output terminal U. The emitter electrode of the semiconductor chip 12c3 may be electrically connected to the output terminal U, and the collector electrode thereof may be electrically connected to the input terminal P1. Likewise, the emitter electrodes of the semiconductor chips 12c5 and 12c4 may be electrically connected to the input terminals N2 and N3, respectively, and the collector electrodes thereof may be electrically connected to the output terminals V and W, respectively. Furthermore, the emitter electrodes of the semiconductor chips 12c2 and 12c1 may be electrically connected to the output terminals V and W, respectively, and the collector electrodes thereof may be electrically connected to the input terminals P2 and P3, respectively.

The semiconductor chips 12c1 to 12c6 may be switched alternately according to a signal input to the corresponding control terminals. In the present embodiment, each semiconductor chip 12c1 to 12c6 may be heated up during the switching. The input terminals P1, P2, and P3 may be connected to the positive electrode of an external power supply, the input terminals N1, N2, and N3 may be connected to the negative electrode of the external power supply, and the output terminals U, V, and W may be connected to a load. The input terminals P1, P2, and P3 may be electrically connected to each other, and the other input terminals N1, N2, and N3 may be electrically connected to each other.

The disclosed technique makes it possible to prevent a reduction in cooling performance, which leads to preventing a reduction in the reliability of a semiconductor device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
   a semiconductor module including an insulated circuit substrate and a semiconductor chip mounted on the insulated circuit substrate; and
   a cooling device including a top plate having a front surface on which the semiconductor module is disposed and a rear surface opposite to the front surface, and a sidewall connected to the top plate, wherein
   the top plate is rectangular in a plan view of the semiconductor device, and includes
      a flow path region where a flow path of coolant is formed,
      an outer edge region where the flow path is not formed, and
      a sidewall connection region to which the sidewall is connected so as to surround an outer periphery of the flow path region to define the flow path,
   the flow path region includes
      a cooling region where a plurality of fins are disposed, and
      a first communicating region and a second communicating region where no fin is disposed, the first and second communicating regions respectively extending in a long-side direction of the top plate so as to sandwich the cooling region therebetween in a short-side direction of the top plate,
   in a thickness direction orthogonal to the top plate, the cooling region has a first thickness and the outer edge region has a second thickness, the first thickness being less than is the second thickness, and
   each of the first communicating region and the second communicating region has an outer edge region-side portion located adjacent to the outer edge region and a cooling region-side portion located adjacent to and closer to the cooling region than is the outer edge region-side portion, and a thickness of the outer edge region-side portion is greater than is a thickness of the cooling region-side portion.

2. The semiconductor device according to claim 1, wherein
   the front surface of the top plate is level, and
   the rear surface of the top plate has a recess in the cooling region such that the rear surface of the cooling region is closer in the thickness direction to the front surface of the top plate than is the rear surface of the outer edge region.

3. The semiconductor device according to claim 1, wherein in each of the first communicating region and the second communicating region,
   the thickness of the cooling region-side portion is the first thickness, and
   the thickness of the outer edge region-side portion is the second thickness.

4. The semiconductor device according to claim 1, further comprising one or more stepped portions in each of the first communicating region and the second communicating region between the cooling region and the outer edge region,
   wherein a thickness of each of the first communicating region and the second communicating region of the top plate increases at each of the one or more stepped portions thereof, in a direction from the cooling region toward the outer edge region.

5. The semiconductor device according to claim 4, wherein the one or more stepped portions is one stepped portion, and is located adjacent to an edge of the sidewall connection region.

6. The semiconductor device according to claim 4, wherein in each of the first communicating region and the second communicating region, an innermost stepped portion that is closest to the cooling region among the one or more stepped portions is located adjacent to an edge of the cooling region.

7. The semiconductor device according to claim 1, further comprising:
   the sidewall connected to the rear surface of the top plate at the sidewall connection region; and
   a bottom plate provided on the sidewall, at a side of the sidewall opposite to a side of the sidewall where the top plate is disposed, so as to face the top plate, wherein
   the top plate, the sidewall and the bottom plate together form a flow path section where the flow path of the coolant is formed,
   the bottom plate has an inlet at a position within an area overlapping the first communicating region in the plan view and an outlet at a position within an area overlapping the second communicating region in the plan view, the inlet allowing the coolant to flow into the flow path section, the outlet allowing the coolant to flow out of the flow path section.

8. The semiconductor device according to claim 7, wherein
   the outer edge region-side portion in the first communicating region extends from the sidewall to the inlet in the short-side direction, and
   the outer edge region-side portion in the second communicating region extends from the sidewall to the outlet in the short-side direction.

9. The semiconductor device according to claim 7, wherein
   the cooling region-side portion in the first communicating region extends from the cooling region to the inlet in the short-side direction, and
   the cooling region-side portion in the second communicating region extends from the cooling region to the outlet in the short-side direction.

10. The semiconductor device according to claim 1, wherein a maximum thickness of the outer edge region-side portion is the second thickness.

11. A semiconductor device, comprising:
    a semiconductor module including an insulated circuit substrate and a semiconductor chip mounted on the insulated circuit substrate;

a cooling device including a top plate having a front surface on which the semiconductor module is disposed and a rear surface opposite to the front surface; and a relief plate disposed on the rear surface of the top plate, wherein the top plate is rectangular in a plan view of the semiconductor device and includes a sidewall connection region, a flow path region, and an outer edge region, each of which is respectively set at the rear surface of the top plate, the flow path region including a cooling region, a first communicating region and a second communicating region, each extending in a long-side direction of the top plate, the first communicating region and the second communicating region sandwiching the cooling region therebetween in a short-side direction of the top plate, the sidewall connection region surrounding an outer periphery of the flow path region, the outer edge region being outside of the sidewall connection region and closer to an edge of the top plate than is the flow path region, and in a thickness direction orthogonal to the top plate, the cooling region has a first thickness and the outer edge region has a second thickness, the first thickness being less than is the second thickness.

12. The semiconductor device according to claim 11, wherein the semiconductor module is disposed within an area on the front surface of the top plate that overlaps the cooling region in the plan view, a width in the short-side direction of the cooling region is narrower than is a width of the insulated circuit substrate, the insulated circuit substrate is disposed on the front surface of the top plate such that the insulated circuit substrate has a projecting portion that is located in the short-side direction outside an area overlapping the cooling region and within an area overlapping at least one of the first communicating region and the second communicating region in the plan view, and the relief plate is disposed such that the relief plate and the projecting portion overlap each other in the plan view.

13. The semiconductor device according to claim 12, wherein the relief plate extends up to the sidewall connection region in the short-side direction of the top plate.

14. The semiconductor device according to claim 13, wherein each of the first communicating region and the second communicating region has an outer edge region-side portion located adjacent to the outer edge region and a cooling region-side portion located adjacent to the cooling region, the cooling region-side portion being closer to the cooling region than is the outer edge region-side portion, and a total thickness of the top plate and the relief plate is greater in the outer edge region-side portion than in the cooling region-side portion.

15. The semiconductor device according to claim 14, wherein the total thickness of the cooling region-side portion is the first thickness, and the total thickness of the outer edge region-side portion is the second thickness.

16. The semiconductor device according to claim 14, further comprising one or more stepped portions disposed in the at least one of the first communicating region and the second communicating region within which the projecting portion is located in the plan view, between the cooling region and the outer edge region, and the total thickness of the top plate and the relief plate increases at each of the one or more stepped portions in a direction from the cooling region toward the outer edge region.

17. The semiconductor device according to claim 16, wherein the one or more stepped portions is one stepped portion and is adjacent to an edge of the sidewall connection region.

18. The semiconductor device according to claim 16, wherein an innermost stepped portion is provided adjacent to, and closest among the one or more stepped portions to an edge of the cooling region.

19. The semiconductor device according to claim 16, wherein the one or more stepped portions each have an inclined surface to connect between portions of the rear surface with different heights in the thickness direction from the top surface of the top plate.

20. The semiconductor device according to claim 12, wherein a total thickness of the top plate and the relief plate is the second thickness.

21. The semiconductor device according to claim 11, further comprising:

a sidewall connected to the rear surface of the top plate at the sidewall connection region; and a bottom plate provided on the sidewall, at a side of the sidewall opposite to a side of the sidewall where the top plate is disposed, so as to face the top plate, wherein the semiconductor module is disposed within an area on the front surface of the top plate that overlaps the cooling region in the plan view, the top plate, the sidewall and the bottom plate together form a flow path section where coolant flows, the bottom plate has an inlet at a position within an area overlapping the first communicating region in the plan view and an outlet at a position within an area overlapping the second communicating region in the plan view, the inlet allowing the coolant to flow into the flow path section, the outlet allowing the coolant to flow out of the flow path section.

22. The semiconductor device according to claim 21, wherein the insulated circuit substrate is disposed on the front surface of the top plate such that the insulated circuit substrate has a projecting portion that is located in the short-side direction outside of the cooling region and within at least one of the first communicating region and the second communicating region in the plan view, and in the at least one of the first communicating region and the second communicating region within which the projecting portion is located in the plan view, the outer edge region-side portion extends from the sidewall to a corresponding one of the inlet and the outlet therein.

23. The semiconductor device according to claim 21, wherein in the at least one of the first communicating region and the second communicating region within which the projecting portion is located, the cooling region-side portion extends from the cooling region to a corresponding one of the inlet and the outlet.

* * * * *